US009054280B2

(12) United States Patent
Maeno et al.

(10) Patent No.: US 9,054,280 B2
(45) Date of Patent: Jun. 9, 2015

(54) LIGHT EMITTING MODULE

(71) Applicant: Koito Manufacturing Co., Ltd., Minato-ku (JP)

(72) Inventors: Yuzo Maeno, Shizuoka (JP); Kazuhiro Ito, Shizuoka (JP); Osamu Kuboyama, Shizuoka (JP); Hisayoshi Daicho, Shizuoka (JP); Shogo Sugimori, Shizuoka (JP)

(73) Assignee: KOITO MANUFACTURING CO., LTD., Minato-Ku, Tokyo (JP)

( * ) Notice: Subject to any disclaimer, the term of this patent is extended or adjusted under 35 U.S.C. 154(b) by 0 days.

(21) Appl. No.: 14/203,604

(22) Filed: Mar. 11, 2014

(65) Prior Publication Data

US 2014/0191271 A1     Jul. 10, 2014

Related U.S. Application Data

(63) Continuation of application No. PCT/JP2012/005733, filed on Sep. 11, 2012.

(30) Foreign Application Priority Data

Sep. 13, 2011 (JP) ................................. 2011-199634

(51) Int. Cl.
*H01L 33/00* (2010.01)
*H01L 33/50* (2010.01)
*H01L 25/075* (2006.01)

(52) U.S. Cl.
CPC ............. *H01L 33/50* (2013.01); *H01L 25/0753* (2013.01); *H01L 33/504* (2013.01); *H01L 2924/0002* (2013.01)

(58) Field of Classification Search
CPC .... H01L 33/504; H01L 25/0753; H01L 33/50
USPC ........................................... 257/440; 438/70
See application file for complete search history.

(56) References Cited

U.S. PATENT DOCUMENTS 7,777,412 B2 *   8/2010  Pang ............................. 313/506
8,226,263 B2 *   7/2012  Van Woudenberg et al. . 362/231
(Continued)

FOREIGN PATENT DOCUMENTS

JP     2005-277127    10/2005
JP     2005-302920    10/2005
(Continued)

OTHER PUBLICATIONS

International Preliminary Report on Patentability (Form PCT/IB/373) and the Written Opinion of the International Searching Authority (Form PCT/ISA/237) issued on Mar. 18, 2014, by the International Bureau of WIPO in corresponding International Application No. PCT/JP2012/005733 with an English translation thereof. (9 pgs).

(Continued)

*Primary Examiner* — Nicholas Tobergte
(74) *Attorney, Agent, or Firm* — Buchanan Ingersoll & Rooney PC

(57) ABSTRACT

In a light emitting module, a red phosphor is contained in a second phosphor layer so that the wavelength of a second phosphor layer after the wavelength conversion is longer than that of a first phosphor layer. And a blue phosphor and a yellow-green phosphor are contained in the first phosphor layer. The first phosphor layer is formed in an illumination area of light emitted from an LED chip, and the first phosphor layer converts the wavelength of the light from the LED chip and emits the wavelength-converted light from an emission surface. A part of the second phosphor layer is formed in a non-direct area where no light is illuminated from the LED chip and where light is illuminated from the first phosphor layer. The part of the second phosphor layer formed in the non-direct illumination area converts the wavelength of the light emitted from the first phosphor layer.

2 Claims, 13 Drawing Sheets

(56) References Cited

U.S. PATENT DOCUMENTS

| | | | |
|---|---|---|---|
| 8,652,357 B2 * | 2/2014 | Ryu et al. | ............ 252/301.4 F |
| 2011/0096560 A1 | 4/2011 | Ryu et al. | |

FOREIGN PATENT DOCUMENTS

| | | |
|---|---|---|
| JP | 2006-253336 | 9/2006 |
| JP | 2006-352037 A | 12/2006 |
| WO | 2008-096545 A1 | 8/2008 |

OTHER PUBLICATIONS

International Search Report (Form PCT/ISA/210) issued on Dec. 18, 2012, by the Japanese Patent Office in corresponding International Application No. PCT/JP2012/005733 with an English translation thereof. (4 pgs).

Korean Notification of Reason(s) for Refusal dated Dec. 30, 2014 issued in the corresponding Korean Patent Application No. 10-2014-7009318 and English translation (7 pages).

* cited by examiner

| | Ra |
|---|---|
| 2ND EXEMPLARY EMBODIMENT | 83.9 |
| 2ND COMPARATIVE EXAMPLE | 74.1 |

160

162

164

164

166

166

172

174

174

176

176

LIGHT EMITTING MODULE

CROSS-REFERENCE TO RELATED APPLICATIONS

This application is based upon and claims the benefit of priority from the prior Japanese Patent Application No. 2011-199634, filed on Sep. 13, 2011 and International Patent Application No. PCT/JP2012/005733, filed on Sep. 11, 2012, the entire content of each of which is incorporated herein by reference.

BACKGROUND OF THE INVENTION

1. Field of the Invention

The present invention relates to a light emitting module and, in particular, a light emitting module equipped with a phosphor layer that converts the wavelength of incident light and then radiates the wavelength-converted light.

2. Description of the Related Art

In recent years, use of semiconductor light-emitting elements, such as light emitting diodes (LEDs), has grown very quickly in automotive headlamps, general illumination and so forth. When white light is to be obtained using such semiconductor light-emitting elements, a light wave conversion member is generally provided in a position facing a light emitting surface of the semiconductor light-emitting element that emits light such as blue light, near-ultraviolet light or short-wavelength visible light. Here, the light wave conversion member converts light excited by the light-emitting element and then emits the converted light having a different wavelength. A device where a yellow phosphor, which is excited by blue light and then emits yellow light, is provided in a position facing an LED emitting the blue light, is known as an LED light emitting device of a white light-emitting type.

In order to obtain a white light with high color rendering properties, the wavelengths of three primary colors of light, namely blue, green and red light colors of light, are required. For this reason, the aforementioned white-light LED light emitting device, in which the blue LED and the yellow phosphor are combined, still has room for improvement in the color rendering properties. For the purpose of improving the color rendering properties, a white-light emitting lamp having a blue phosphor, a yellow phosphor and a red phosphor is proposed (see International Publication Number WO2008/096545, for instance). In this white-light emitting lamp, a light wavelength conversion member is first excited by light emitted by a semiconductor light-emitting element that emits light having a peak wavelength at 370 nm to 470 nm (both inclusive) and then emits white light.

The red phosphor, however, absorbs blue light and yellow light, too, whose wavelengths are shorter than that of the red light, and then emits the red light. Thus, as its optical path length is longer, the light emitted is more likely to be tinged with red color. Accordingly, it is possible that the red-tinged light may be more likely to be emitted from an emission surface of the light wavelength conversion member located far from a light emitting surface of the light-emitting element than in other emissions surfaces of the light wavelength conversion member located near the light emitting surface of the light-emitting element. Thus, it is strongly expected and requested that a light wavelength conversion member, which emits light such that the color of light emitted from the emission surfaces is uniform, be developed.

SUMMARY OF THE INVENTION

The present invention has been made to solve the above-described problems, and a purpose thereof is to provide a light wavelength conversion member, having high color rendering properties, which uniformly emits the color of light from the emission surfaces.

To resolve the foregoing problems, a light emitting module according to one embodiment of the present invention includes: a first phosphor layer; and a second phosphor layer, whose wavelength after a conversion of wavelength is longer than that of the first phosphor layer. The first phosphor layer is formed in an illumination area of light emitted from a light emitting element, and the first phosphor layer converts a wavelength of the light from the light emitting element and emits the wavelength-converted light from an emission surface. And at least part of the second phosphor layer is formed in a predetermined area where no light is illuminated from said light emitting element and where light is illuminated from the first phosphor layer, and the at least part of the second phosphor layer formed in said predetermined area converts the wavelength of the light from the first phosphor layer and emits the wavelength-converted light from the emission surface through the first phosphor layer.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1A:
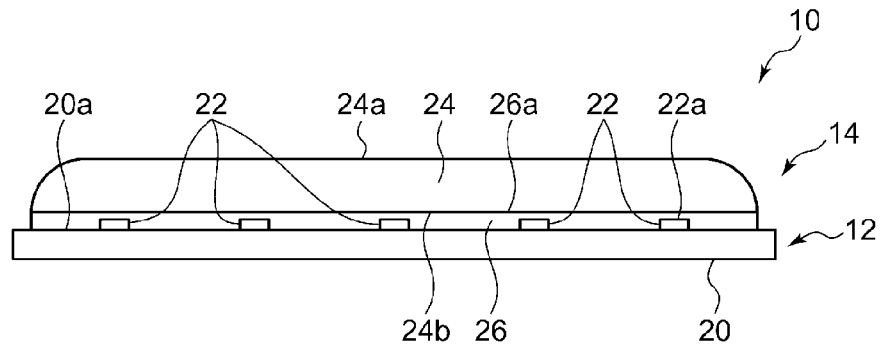
FIG. 1A is a front sectional view of a light emitting module according to a first exemplary embodiment.

The invention will now be described by reference to the preferred embodiments. This does not intend to limit the scope of the present invention, but to exemplify the invention.

A light emitting module according to one embodiment of the present invention includes: a first phosphor layer; and a second phosphor layer, whose wavelength after a conversion of wavelength is longer than that of the first phosphor layer. The first phosphor layer is formed in an illumination area of light emitted from a light emitting element. And the first phosphor layer converts the wavelength of the light from the light emitting element and emits the wavelength-converted light from an emission surface. At least part of the second phosphor layer is formed in a predetermined area where no light is illuminated from said light emitting element and where light is illuminated from the first phosphor layer, and the part of the second phosphor layer formed in said predetermined area converts the wavelength of the light from the first phosphor layer and emits the wavelength-converted light from the emission surface through the first phosphor layer.

First of all, this embodiment can avoid the situation where light, which has been wavelength-converted in the first phosphor layer, is again wavelength-converted by phosphors, contained in the second phosphor layer, in the first phosphor layer. This feature in this embodiment is compared to the case where provided is a mixed phosphor layer, in which phosphors contained in the first phosphor layer and those contained in the second phosphor layer are mixed together. As a result, the color of emitted light can be made uniform regardless of whether the optical path length of light in the first phosphor layer is long or short. Also, in the first phosphor layer, the phosphors emit light not only in a direction toward the emission surface but also in other directions than said direction toward the emission surface. By employing this embodiment, part of such light can be again wavelength-converted in the second phosphor layer. As a result, the light that has been again wavelength-converted in the second phosphor layer can be also mixed into the light traveling in the other directions, than the direction toward the emission surface, in the first phosphor layer. This allows the color of emitted light to be made uniform regardless of whether the optical path length of light is long or short, too.

At least part of the second phosphor layer may be formed in between a plane including a light emitting surface of the light emitting element and a mounting surface of a substrate on which the light emitting element is mounted, and the first phosphor layer may be formed nearer to a light emitting direction side of the light emitting surface than the second phosphor layer.

In the first phosphor layer, there is light that travels in a direction toward the mounting surface of the substrate, too. According to this embodiment, part of such light can be again wavelength-converted in the second phosphor layer. As a result, the light that has been again wavelength-converted in the second phosphor layer can be mixed into the light that travels from the first phosphor layer toward the mounting surface of the substrate. Thus, the color of emitted light can be made uniform regardless of whether the optical path length of light is long or short.

The second phosphor layer may be formed starting from the mounting surface and further toward the light emitting direction side of the light emitting surface beyond the plane, in such a manner as to cover the light emitting surface. According to this embodiment, part of light traveling in a direction toward the first phosphor layer can be wavelength-converted in the second phosphor layer. Thus, the light that has been wavelength-converted in the second phosphor layer can be appropriately contained into the light emitted from the first phosphor layer.

A plurality of light emitting elements may be arranged such the light emitting elements are spaced apart from each other and such that each emitting surface is included in a plane. And at least part of the second phosphor layer is formed, in a region between the plurality of light emitting elements as viewed from a side of the light emitting surface, on an opposite side to a light emitting direction side of the light emitting surface, which is located downwardly from the plane including the light emitting surface of the light emitting element; the first phosphor layer may be formed nearer to the light emitting direction side of the light emitting surface than the second phosphor layer. According to this embodiment, the color unevenness in the light emitted in the region between the plurality of light emitting elements can be suppressed.

The exemplary embodiments of the present invention will be hereinbelow described in detail, with reference to the accompanying drawings, by comparing them with comparative examples.

(First Exemplary Embodiment)

Figure 1B:
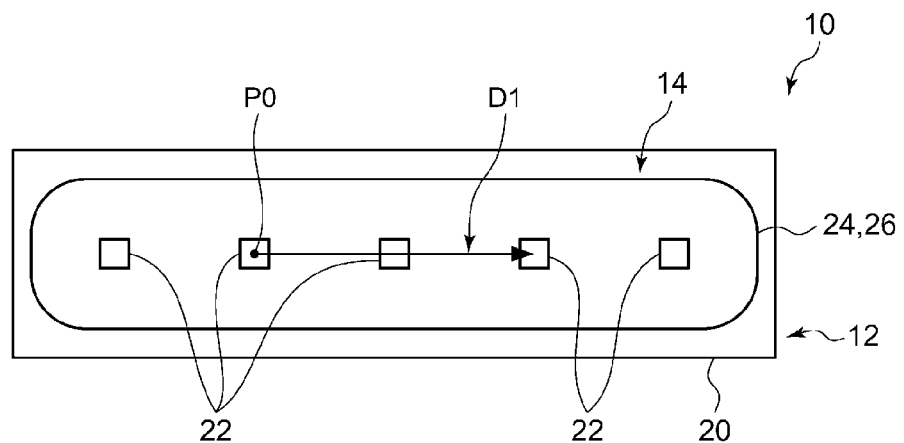
FIG. 1B is a top view of a light emitting module according to a first exemplary embodiment.

FIG. 1A is a front sectional view of a light emitting module 10 according to a first exemplary embodiment. FIG. 1B is a top view of the light emitting module 10 according to the first exemplary embodiment. The light emitting module 10 is comprised of an LED unit 12 and a phosphor unit 14.

The LED unit 12 has a substrate 20 and a plurality of LED chips 22. The substrate 20 has a long rectangular outer shape. A plurality of LED chips 22 are mounted, in advance, on a mounting surface 20a of the substrate 20 in a manner such that the plurality of LED chips 22 are spaced equally from each other and arranged in a line in a direction extending along the substrate 20. In this state, not only the LED chips 22 but also bonding wires, a Zener diode as well as a sub-mount and the like, if necessary, are mounted.

In the first exemplary embodiment, the plurality of LED chips 22 are arranged such that the interval between the LED chips 22 is 8 mm. It goes without saying that the interval between the adjacent LED chips 22 is not limited to 8 mm. In this manner, the plurality of LED chips 22 are arranged such that the LED chips 22 are mutually spaced apart from each other and each light emitting surface 22a is included in a plane. Note that the plurality of LED chips 22 may be mounted on the substrate 20 such that the plane including the light emitting surfaces 22a may mutually differ.

Each LED chip 22 has the light emitting surface 22a formed of a square (1 mm×1 mm). A rear surface of the light emitting surface 22a is mounted on the mounting surface 20a of the substrate 20. Thus, the light emitting surfaces 22a of the plurality of LED chips 22 are all placed parallel to the mounting surface 20a. In the first exemplary embodiment, five LED chips 22 are mounted on the substrate 20. It goes without saying that the number of LED chips 22 is not limited to five, and a plurality of LED chips 22 the number of which is other than five may be mounted on the substrate 20. Also, the light emitting module 10 is not limited to a light emitting module where a plurality of LED chips 22 are arranged side by side on a straight line, and the light emitting module 10 may be such that a plurality of LED chips 22 may be arranged side by side in parallel with the mounting surface 20a in a two-dimensional direction. Note that the mounting surface 20a of the substrate 20 may be of a shape having raised and recessed surfaces (e.g., a shape having different levels) such that the planes including the light emitting surfaces 22a of the plurality of LED chips 22 are mutually different. Thus, in this case, the plurality of LED chips 22 may be mounted on the recessed surfaces and the raised surfaces. Also, the planes including the light emitting surfaces 22a of the plurality of LED chips 22 may be mutually different such that the thickness of the sub-mount or a component similar to the sub-mount on the mounting surface of substrate 20 is varied.

The LED chip 22 is a semiconductor light-emitting element, and the semiconductor light-emitting element that emits short-wavelength visible light or near-ultraviolet light is used in the first exemplary embodiment. Note that the LED chip 22 is not limited thereto and, for example, the LED chip 22 may be a semiconductor light-emitting element that emits blue light.

The phosphor unit 14 has a first phosphor layer 24 and a second phosphor layer 26. The first phosphor layer 24 contains blue phosphors (not shown) and yellow-green phosphors (not shown). The blue phosphor is excited by the short-wavelength visible light and then emits blue light. The yellow-green phosphor is excited by the short-wavelength visible light or near-ultraviolet light and then emits yellow-green light. A green phosphor, which is excited by the short-wavelength visible light or near-ultraviolet light and then emits green light, or a yellow-to-orange phosphor, which is excited thereby and emits yellow-to-orange light, may be used in substitution for or in addition to the yellow-green phosphor. The second phosphor layer 26 contains red phosphors. The red phosphor is excited by the short-wavelength visible light or near-ultraviolet light and then emits red light. Thus, the wavelength of light after the wavelength conversion in the second phosphor layer 26 is longer than that in the first phosphor layer 24.

The second phosphor layer 26 is directly applied to the mounting surface 20a of the substrate 20 on which the LED chips 22 have been mounted. The first phosphor layer 24 is further applied on top of this second phosphor layer 26. In this manner, the second phosphor layer 26 and the first phosphor layer 24 are stacked, in this order, on the mounting surface 20a of the substrate 20.

A detailed description is given hereunder of a specific method for fabricating a light emitting module 10. On the assumption that a fluorescent lamp will be replaced, the light emitting module 10 is fabricated such that the chromaticity coordinates are (0.41, 0.39).

Five LED chips 22 are first mounted on the substrate 20 where a circuit pattern is formed. At this time, the LED chips 22 are arranged as described above. The red phosphor is dispersed in a transparent resin or coating material and thereby a red phosphor paste is adjusted. At this time, a nitride phosphor, emitting red light, whose general formula is $(Ca_{1-x-y}Sr_x)AlSiN_3:Eu^{2+}{}_y$, is used as the red phosphor. Note that a nitride phosphor, emitting red light, expressed by a general formula $(Ca_{1-x}Eu_x)Si_5N_8$ is used as the red phosphor. It goes without saying that the red phosphor is not limited to these described herein.

The phosphor concentration in the red phosphor paste is 10 vol %. Note the phosphor concentration in the red phosphor paste may be set to a value in a range of 0.5 to 15 vol %. The resin used herein to seal a phosphor 1 may be any one of a silicon-based resin (e.g., dimethyl silicone/phenyl silicone/acrylic silicone-based resin), a sol-gel (silica, titania, or the like)-based resin, an epoxy-based resin, an acrylic-based resin, a polyurethane-based resin, a polyester-based resin, a PET (polyethylene terephthalate)-based resin, a fluoropolymer-based resin, a melamine-based resin, PVA (polyvinyl alcohol)-based resin, and a PVB (polyvinyl butyral)-base resin.

The red phosphor paste adjusted as above is applied to the mounting surface 20a of the substrate 20 on which the LED chips 22 have been mounted. At this time, the application of the red phosphor paste is done such that the thickness of the second phosphor layer 26 is 80 μm. Note that the thickness of the second phosphor layer 26 may be set to a value in a range of 20 to 200 μm. More specifically, a dam of a predetermined thickness is fabricated on the substrate 20 and then the red phosphor paste is poured into the dam and applied thereto by using a method such as dispensing coating or potting. The thus coated red phosphor paste is partially or fully cured in a condition suited to a resin material used.

Then, a mixed phosphor, in which the blue phosphor and the yellow-green phosphor are mixed together, prepared. The mixture ratio (mass ratio) of [blue phosphor]:[yellow-green phosphor] may be selected, as appropriate, in a range of 20:80 to 65:35. For example, in the present exemplary embodiment, [blue phosphor]:[yellow-green phosphor] is 60:40. The mixed phosphor is dispersed in the silicone resin and thereby a mixed phosphor paste is adjusted. The blue phosphor used herein is a blue phosphor expressed by the following general formula.

$$M^1{}_a(M^2O_4)_bX_c:Re_d. \qquad \text{The general formula}$$

Here, $M^1$ contains, as essential component(s), at least one type of element selected from the group consisting of Ca, Sr, and Ba, and can be replaced by any one of elements selected from the group consisting of Mg, Zn, Cd, K, Ag, and Tl. $M^2$, contains P as an essential component, can be replaced by any one of elements selected from the group consisting of V, Si, As, Mn, Co, Cr, Mo, W, and B. X indicates at least one type of halogen element. Re, which contains $Eu^{2+}$ as an essential component, indicates at least one type of rare-earth element or Mn. "a", "b", "c", and "d" each lies in a range such that $4.2 \le a \le 5.8$, $2.5 \le b \le 3.5$, $0.8 < c < 1.4$, and $0.01 < d < 0.1$, respectively. Note that the blue phosphor is not limited to the above formula and its specific conditions.

Also, the blue phosphor used herein may be a blue phosphor expressed by the following general formula.

$$M^1{}_{1-a}MgAl_{10}O_{17}:Eu^{2+}{}_a. \qquad \text{The general formula}$$

Here, $M^1$ contains is at least one type of element selected from the group consisting of Ca, Sr, Ba and Zn. "a" lies in a range such that $0.001 \le a \le 0.5$.

Also, the blue phosphor used herein may be a blue phosphor expressed by the following general formula.

$$M^1{}_{1-a}MgSi_2O_8:Eu^{2+}{}_a. \qquad \text{The general formula}$$

Here, $M^1$ contains is at least one type of element selected from the group consisting of Ca, Sr, and Ba. "a" lies in a range such that $0.001 \le a \le 0.8$.

Also, the blue phosphor used herein may be a blue phosphor expressed by the following general formula.

$$M^1{}_{2-a}(B_5O_9)X:Re_a. \qquad \text{The general formula}$$

Here, $M^1$ contains is at least one type of element selected from the group consisting of Ca, Sr, Ba and Zn. X indicates at least one type of halogen element. "a" lies in a range such that $0.001 \le a \le 0.5$.

Also, the yellow-green phosphor used herein may be a yellow-green phosphor expressed by the following general formula.

$$Ca_{1-x-y-z-w}Sr_xM^{II}{}_yEu_zM^R{}_w)_7(SiO_3)_6X_2. \qquad \text{The general formula}$$

Here, $M^{II}$ indicates Mg, Ba, or Zn. $M^R$ indicates a rare-earth element or Mn. X, which contains Cl as an essential component, indicates at a plurality of halogen elements. "x", "y", "z", and "w" each lies in a range such that $0.1 < x < 0.7$, $0 \le y < 0.3$, $0 < z < 0.4$, and $0 \le w < 0.1$, respectively. This yellow-green phosphor is rarely excited by the blue light emitted from the aforementioned blue phosphors. Accordingly, the color uniformity of the emitted light is rarely lost even though this yellow-green phosphor and any of the aforementioned blue phosphors are mixed together. Note that the yellow-green phosphor is not limited to the above formula and its specific conditions, and note also that the aforementioned yellow-green phosphor may be replaced by another yellow-green phosphor, a yellow phosphor or a green phosphor.

The phosphor concentration in the mixed phosphor paste is 1.1 vol %. Note that the phosphor concentration in the mixed phosphor paste may be set to a value in a range of 0.1 to 10 vol % and may more preferably be set to a value in a range 0.5 to 8 vol %.

The thus adjusted mixed phosphor paste is further applied on top of the already-coated red phosphor paste in an overlapped manner. At this time, the thickness of the first phosphor layer 24 is 4 mm. Note that the thickness of the first phosphor layer 24 may be set to a value in a range of 0.5 to 18 mm and may more preferably be set to a value in a range of 0.5 to 5 mm.

After, as described above, the second phosphor layer 26 and the first phosphor layer 24 have been applied to the mounting surface 20a of the substrate 20, they are heated and hardened under a condition ranging from at 80° C. and for 15 to 30 minutes to at 150° C. and for 60 minutes, so as to fabricate a light emitting module 10.

The light emitting module 10 according to the first exemplary embodiment is turned on and the chromaticity distribution is measured. The light emitting module 10 is placed such that a plurality of LED chips 22 are arranged side by side along a horizontal direction. And the center of an LED chip 22, which is located second from the leftmost LED chip 22, is set as a reference point PO and then the chromaticity is measured starting from this reference point PO. As illustrated in FIG. 1B, the measurement of the chromaticity is repeated while the a measurement point is moved little by little toward the center of an LED chip 22 located in a position to the right of said LED chip located second from the leftmost LED chip 22 and then up to the center of an LED chip 22 located fourth from the leftmost LED chip 22. After the center of the LED chip 22 located fourth therefrom, the measurement of the chromaticity at the measurement points is terminated. Hereinafter, the direction along which the measurement point moves is referred to as a "measurement direction D1".

Figure 2:
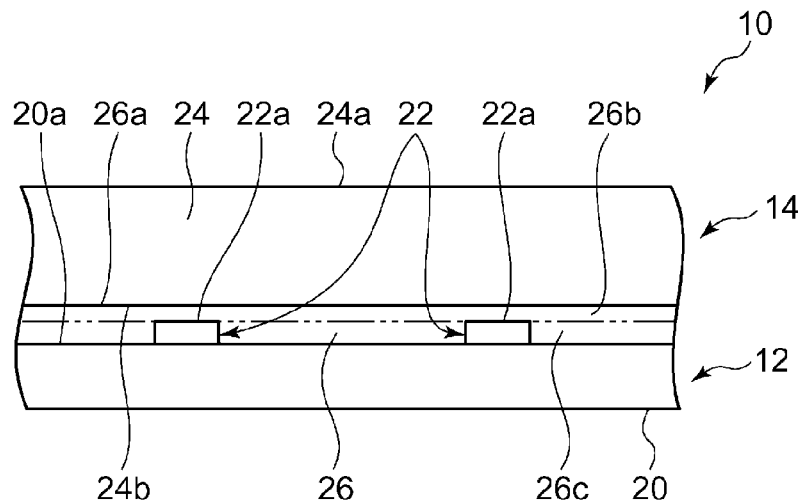
FIG. 2 is an enlarged view of part of a front sectional view of a light emitting module according to the first exemplary embodiment.

FIG. 2 is an enlarged view of part of the front sectional view of the light emitting module 10 according to the first exemplary embodiment. The LED chips 22 are mounted on the mounting surface 20a of the substrate 20. Thus, the light emitted from the light emitting surfaces 22a does not directly reach an area between the plane including the light emitting surfaces 22a of the LED chips 22 and the mounting surface 20a. Hereinafter, this area will be referred to as a "non-direct illumination area". The non-direct illumination areas may also be expressed as the areas between lateral faces 22b of a plurality of LED chips 22.

Now, the red phosphor paste is applied to the mounting surface 20a so as to form the second phosphor layer 26. Accordingly, the second phosphor layer 26 exists in this non-direct illumination area, too. Thus, no red light is emitted from the second phosphor layer 26 in the non-direct illumination area upon receiving the direct light from the LED chips 22.

In the first exemplary embodiment, the second phosphor layer 26 is formed from the mounting surface 20a and further toward a light emitting direction side of the light emitting surface 22a beyond the plane including the light emitting surface 22a. Thus, the second phosphor layer 26 is so formed as to cover the light emitting surfaces 22a. As a result, a part of the second phosphor layer 26 is further formed on a light emitting direction side beyond the plane including the light emitting surface 22a, and another part of the second phosphor layer 26 is formed in the non-direct illumination area. Note that the second phosphor layer 26 may be provided such that all of the second phosphor layer 26 is formed on the non-direct illumination area. In other words, the second phosphor layer 26 may be formed from the mounting surface 20a up to a mounting surface 20a side thereof only up to the height of the plane including the light omitting surface 22a.

The first phosphor layer 24 is applied onto an emission surface 26a of the second phosphor layer 26. Thus, the first phosphor layer 24 is located nearer to a light emitting direction side of the light emitting surface 22a than the second phosphor layer 26. The first phosphor layer 24 is formed in an illumination area of light emitted from the LED chips 22, and the first phosphor layer 24 wavelength-converts the light emitted from the LED chips 22 into yellow-green light and blue light and then emits them from the emission surface.

While the aforementioned non-direct illumination area is not directly illuminated by the light emitted from the LED chip 22, the non-direct illumination area is illuminated by light, which has been wavelength-converted and then emitted from the first phosphor layer 24, directed toward the mounting surface 20a. A part of the second phosphor layer 26 is formed in the non-direct illumination area, and said part of the second phosphor layer 26 formed in the non-direct illumination area converts the wavelength of the light emitted from the first phosphor layer 24 and then emits the wavelength-converted light from an emission surface 24a through the first phosphor layer 24.

In the first exemplary embodiment, the second phosphor layer 26 is formed from the mounting surface 20a and further toward a light emitting direction side of the light emitting surface 22a beyond the plane including the light emitting surface 22a. Thus, a part of the second phosphor layer 26 is so formed as to cover the light emitting surfaces 22a, and another part thereof is formed in the non-direct illumination area. Hereinafter, a portion of the second phosphor layer 26, which is further formed beyond (above) the light emitting surface 22a on the light emitting direction side is called a first layer 26b and a portion thereof, which is formed on a mounting surface 20a side and formed downwardly from the light emitting surface 22a, namely the portion thereof formed in the non-direct illumination area is called a second layer 26c. Note also that the second phosphor layer 26 may be provided such that all of the second phosphor layer 26 is formed on the non-direct illumination area. In other words, the second phosphor layer 26 may be formed from the mounting surface 20a up to a mounting surface 20a side thereof only up to the height of the plane including the light emitting surface 22a.

FIRST COMPARATIVE EXAMPLE

Figure 3A:
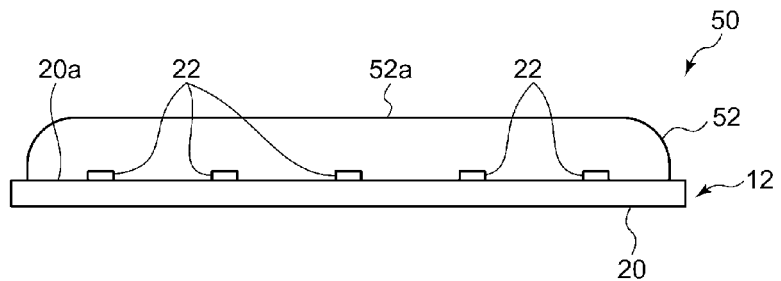
FIG. 3A is a front sectional view of a light emitting module according to a first comparative example.
Figure 3B:
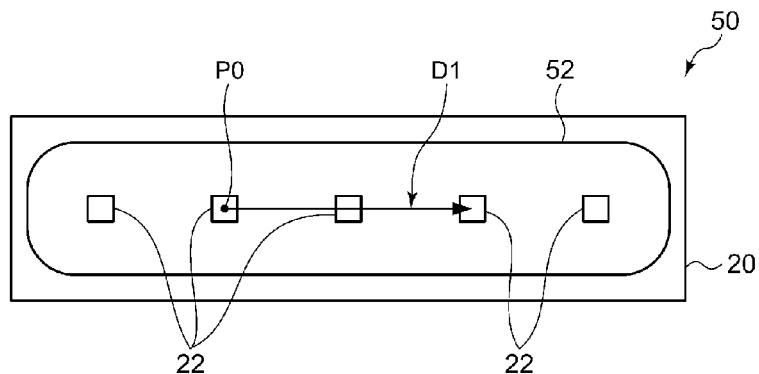
FIG. 3B is a top view of a light emitting module according to a first comparative example.

FIG. 3A is a front sectional view of a light emitting module 50 according to a first comparative example. FIG. 3B is a top view of the light emitting module 50 according to the first comparative example. Hereinbelow, the components in the first comparative example identical to those of the light emitting module 10 according to the first exemplary embodiment are given the identical reference numerals, and the repeated description thereof will be omitted.

The light emitting module 50 includes an LED unit 12 and a phosphor layer 52. The phosphor layer 52 contains the red phosphors, the yellow-green phosphors and the blue phosphors used in the light emitting module 10. In order to prepare a mixed phosphor paste used to form the phosphor layer 52, the blue phosphor, the yellow-green phosphor and the red phosphor are first mixed together at a mixture ratio (mass ratio) of [blue phosphor]:[yellow-green phosphor]:[red phosphor]=57.9:38.6:3.5 and thereby a mixed phosphor is prepared. The mixed phosphor is dispersed in the silicone resin and thereby a mixed phosphor paste is adjusted. The phosphor concentration in the mixed phosphor paste is 1.2 vol %. The thus adjusted mixed phosphor paste is applied on top of the mounting surface 20a of the substrate 20 so as to form the phosphor layer 52. At this time, the width of the phosphor layer 52 is 4 mm.

(EXPERIMENTAL RESULT 1)

Figure 4:
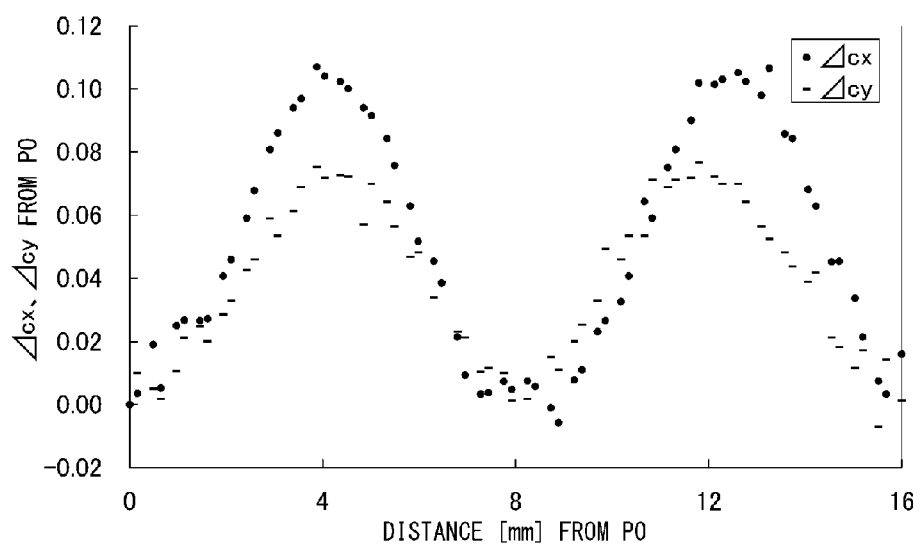
FIG. 4 is a diagram showing an experimental result obtained when, in a light emitting module according to a first comparative example, the chromaticity was measured while a measurement point was moved, along a measurement direction D1, from a reference point PO.

FIG. 4 is a diagram showing an experimental result obtained when, in the light emitting module 50 according to the first comparative example, the chromaticity was measured while the measurement point was moved, along the measurement direction D1, from the reference point PO. $\Delta cx$ and $\Delta cy$ in a vertical axis indicate change amounts at color coordinates (cx, cy) in CIE (International Commission on Illumination) chromaticity coordinates with the CIE chromaticity at the reference point PO defined as the reference value.

In FIG. 4, the spots whose distance from the reference point PO are 0 mm, 8 mm, and 16 mm are the center of the light emitting surface 22a of an LED chip 22 located second from the leftmost LED chip 22, the center thereof located third therefrom, and the center thereof located fourth therefrom in FIG. 3B, respectively. It is evident from FIG. 4 that the color difference from the reference point PO indicates a small value at the center of the light emitting surface 22a of each LED chip 22. However, for the spots between the two adjacent LED chips 22, the color difference from the reference point PO becomes a larger value as the spot approaches an intermediate point of the two LED chips 22. Thus, the intermediate point of the two LED chips indicates the largest value of the color difference from the reference point PO.

FIG. 4 indicates that the larger the values of $\Delta cx$ and $\Delta cy$ become, the emitted light is more likely to be tinged with red color. Thus, in the light emitting module 50 according to the first comparative example, the emitted light is tinged with red color at locations between the adjacent LED chips 22. As a result, one finds that the color of the emitted light is not uniform in the light emitting module 50 according to the first comparative example.

Figure 5:
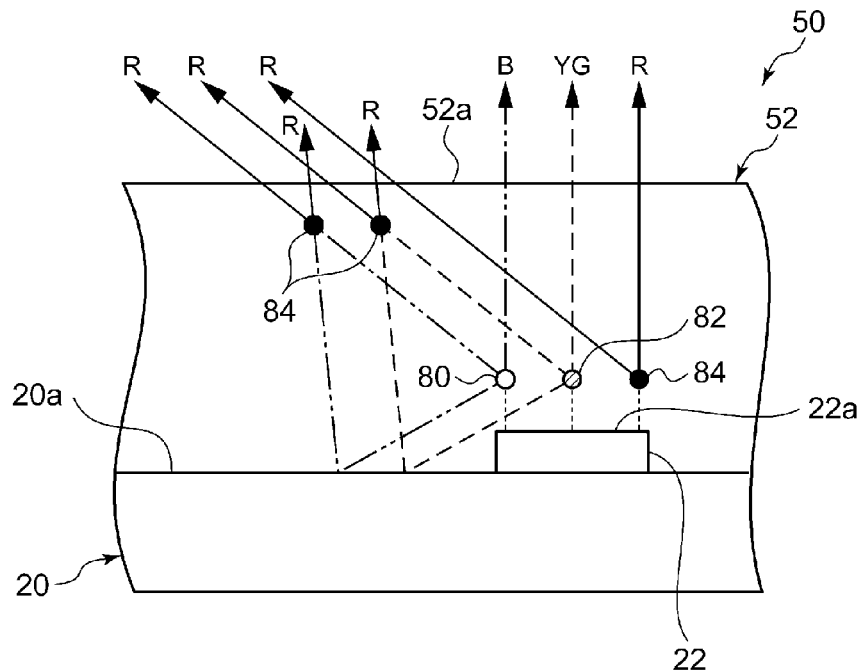
FIG. 5 is a cross-sectional view of a light emitting module to explain a mechanism of how the color unevenness is generated in the first comparative example.

FIG. 5 is a cross-sectional view of the light emitting module 50 to explain a mechanism of how the color unevenness is generated in the first comparative example. Hereinbelow, the aforementioned blue phosphor and the yellow-green phosphor contained in the first phosphor layer 24 and the phosphor layer 52 are referred to as a "blue phosphor 80" and a "yellow-green phosphor 82", respectively. Similarly, the aforementioned red phosphor contained in the second phosphor layer 26 and the phosphor layer 52 are referred to as a "red phosphor 84".

In the light emitting module 50 according to the first comparative example, the blue phosphor 80, the yellow-green phosphor 82 and the red phosphor 84 are mixed in the phosphor layer 52. Accordingly, as shown in FIG. 5, it is relatively unlikely that light emitted, with a short optical path length, in the light emitted from the LED chip 22, namely the light, which is emitted from a position near the LED chip 22, on an emission surface 52a, will be again wavelength-converted by the red phosphor 84 so as to be red light. Here, the "light, which is emitted from a location near the LED chip 22" is the blue light after the wavelength conversion by the blue phosphor 80 and the yellow-green light after the wavelength conversion by the yellow-green phosphor 82; that is, all of these converted light rays are located relatively near the LED chip 22. In contrast to this, it is relatively likely that light emitted with a long optical path length after emission from the LED chip 22, namely the light, which is emitted from a position farther away from the LED chip 22, on the emission surface 52a, will be again wavelength-converted by the red phosphor 84 so as to be red light. In this case, the "light, which is emitted from a position farther away from the LED chip 22" is the blue light after the wavelength conversion by the blue phosphor 80 and the yellow-green light after the wavelength conversion by the yellow-green phosphor 82; that is, all of these converted light rays are located relatively farther away from the LED chip 22. This is why, as shown in FIG. 4, the emitted light is tinged with red color at locations between the adjacent LED chips 22, in the light emitting module 50 according to the first comparative example. Note that the light emitted with a long optical path length after emission from the LED chip 22 includes light rays, where the light emitted from the blue phosphor 80 and the yellow-green phosphor 82 is directly emitted through a part of the emission surface 52a that is located farther away from the LED chip 22, and light rays, where the light emitted from the blue phosphor 80 and the yellow-green phosphor 82 is once reflected by the mounting surface 20a and then the reflected light emits from the part of the emission surface 52a that is located farther away from the LED chip 22.

Figure 6:
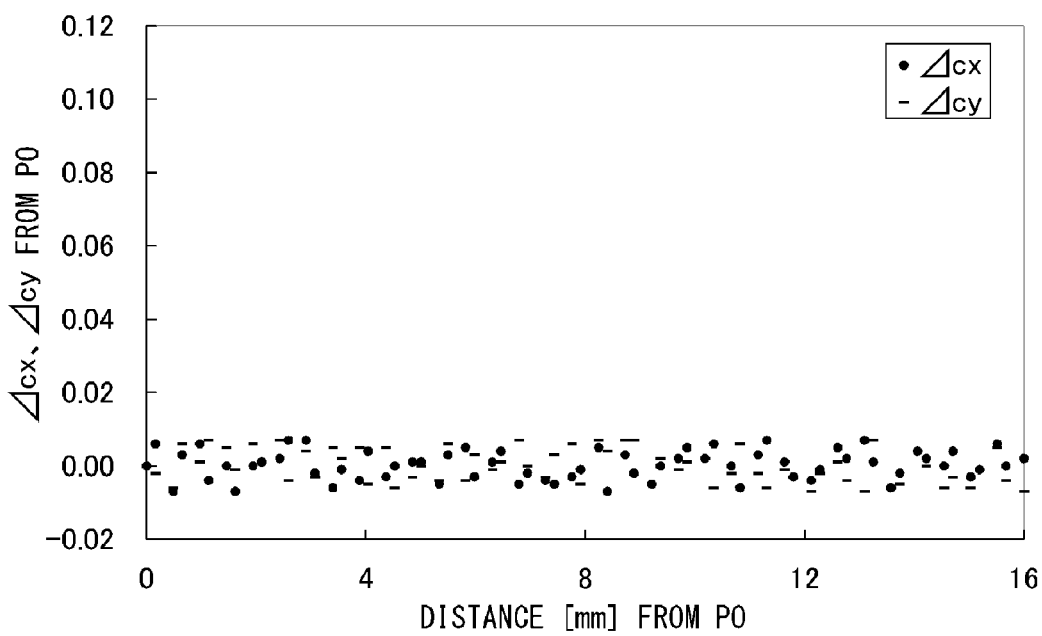
FIG. 6 is a diagram showing an experimental result obtained when, in a light emitting module according to a first f exemplary embodiment, the chromaticity was measured while a measurement point was moved, along a measurement direction D1, from a reference point PO.

FIG. 6 is a diagram showing an experimental result obtained when, in the light emitting module 10 according to the first exemplary embodiment, the chromaticity was measured while a measurement point was moved, along the measurement direction D1, from the reference point PO. In FIG. 6, too, the spots whose distance from the reference point PO are 0 mm, 8 mm, and 16 mm are the center of the light emitting surface 22a of an LED chip 22 located second from the leftmost LED chip 22, the center thereof located third therefrom, and the center thereof located fourth therefrom in FIG. 3B, respectively. However, it is evident from FIG. 6 that $\Delta cx$ and $\Delta cy$ are each mostly uniform regardless of the distance from the reference point PO. Hence, one finds that almost no color unevenness occurs in the light emitting module 10 according to the first exemplary embodiment.

Figure 7:
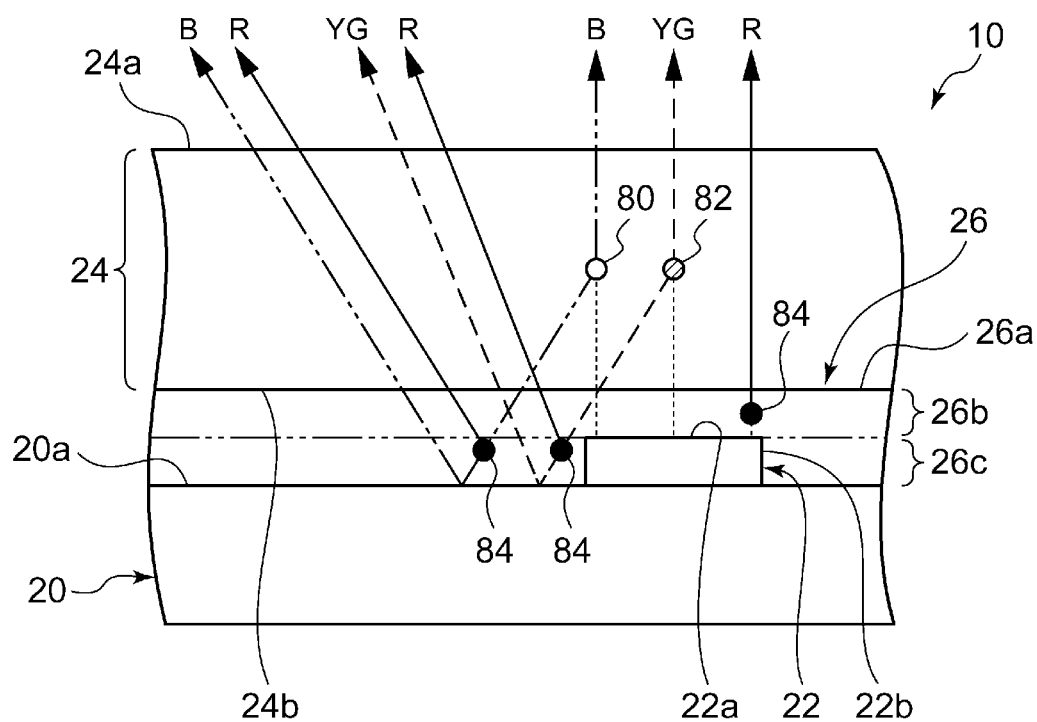
FIG. 7 is a cross-sectional view of a light emitting module to explain a mechanism of how the color unevenness is suppressed in the first exemplary embodiment.

FIG. 7 is a cross-sectional view of the light emitting module 10 to explain a mechanism of how the color unevenness is suppressed in the first exemplary embodiment. As illustrated in FIG. 7, the second phosphor layer 26 is so formed as to cover the light emitting surface 22a. Thus, the light emitted from the light emitting surface 22a is partially converted into red light by the red phosphor 84 of the second phosphor layer 26. In this manner, the red light after conversion and the light, which has not been converted at all, are emitted to the first phosphor layer 24 from the emission surface 26a of the second phosphor layer 26. The light emitted from the second phosphor layer 26 enters the interior of the first phosphor layer 24 through an incident surface 24b in contact with the emission surface 26a.

The blue phosphors 80 and the yellow-green phosphors 82 contained in the first phosphor layer 24 are not excited by red light. Thus the red light in the light that has entered the first phosphor layer 24 is directly emitted (intact) from the emission surface 24a.

Of the light that has entered the first phosphor layer 24, the unconverted light in the second phosphor layer 26 is converted into blue light and yellow-green light by the blue phosphors 80 and the yellow-green phosphors 82, respectively. As described earlier, the yellow-green phosphor 82 is less likely to be excited by the blue light emitted from the blue phosphor 80. As a result, for the light directed toward the emission surface 24a in the first phosphor layer 24, the possibility that the light, which has once been wavelength-converted by any one of the phosphors will be again wavelength-converted by other light is extremely low as compared with the first comparative example.

Inside the first phosphor layer 24, the blue phosphor 80 and the yellow-green phosphor 82 emit blue light and yellow-green light, respectively, in a Lambertian pattern. Thus, light rays are emitted, from the blue phosphor 80 and the yellow-green phosphor 82, toward not only the emission surface 24a but also the mounting surface 20a. The light ray emitted therefrom toward the mounting surface 20a is converted, into the red light emitting in a Lambertian pattern, through the reflection on the mounting surface 20a and by the second phosphor layer 26, and then is emitted from a part of the emission surface 24a, other than a part thereof corresponding to a region vertically upward from the LED chip 22, such as an area between the adjacent LED chips 22. At the same time, as described above, there is provided the second layer 26c of the second phosphor layer 26 on the mounting surface 20a. This second layer 26c is located in a position where the direct light from the light emitting surface 22a cannot be reached but the light, which has been converted by the first phosphor layer 24 and then travels toward the mounting surface 20a, can be reached.

More specifically, a part of the second phosphor layer 26 is formed in the non-direct illumination area, which is located on a mounting surface 20a side and located downward from the plane including the light emitting surface 22a, in a region between a plurality of LED chips 22 as viewed from a light emitting surface 22a side. Accordingly, part of light directed toward the mounting surface 20a in the blue light and the yellow-green light, which have been wavelength-converted in the first phosphor layer 24 and then emitted from the first phosphor layer 24, is converted into red light mainly by the red phosphors 84 contained in this second layer 26c. In this manner, the second phosphor layer 26, which contains the red phosphors 84, is formed in the non-direct illumination area. Thereby, the light, which travels toward the mounting surface 20a in the first phosphor layer 24 and then emits from a part of the emission surface 24a other than a part thereof corresponding to the region vertically upward from the LED chip 22, can also be turned into the light in which the blue light, the yellow-green light and the red light have been appropriately mixed together. From the above results, the light in which the blue light, the yellow-green light and the red light have been appropriately mixed together can be emitted from both a first part of the emission surface 24a and a second part of the emission surface 24a. Here, the first part of the emission surface 24a is part of the emission surface 24a corresponding to the region vertically upward from the light emitting surface 22a, and the second part thereof is the remaining part of the emission surface 24a other than the first part thereof. Note again that, as described above, the emission surface 24a is constituted by the first part and the second part. Thus, the color unevenness can be reduced over the entire emission surface 24a.

(Second Exemplary Embodiment)

Figure 8A:
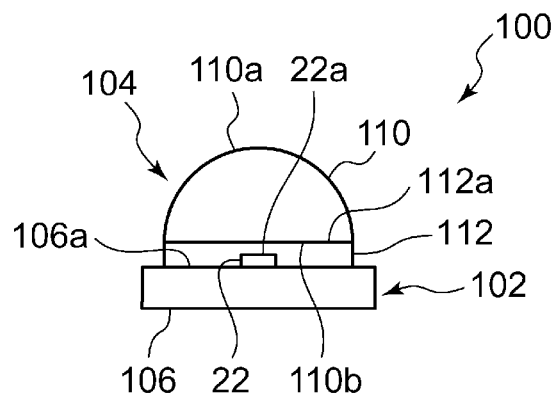
FIG. 8A is a front sectional view of a light emitting module according to a second exemplary embodiment.
Figure 8B:
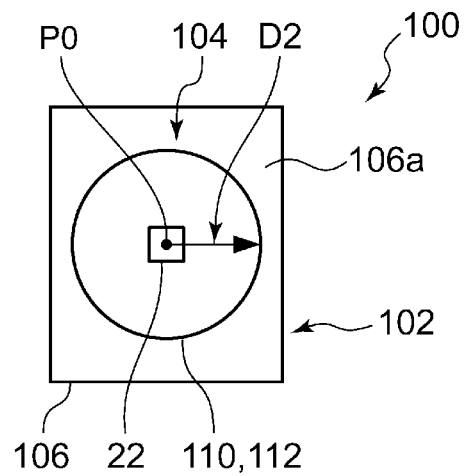
FIG. 8B is a top view of a light emitting module according to a second exemplary embodiment.

FIG. 8A is a front sectional view of a light emitting module 100 according to a second exemplary embodiment. FIG. 8B is a top view of the light emitting module 100 according to the second exemplary embodiment. Hereinbelow, the components in the second exemplary embodiment identical to those of the first exemplary embodiment are given the identical reference numerals, and the repeated description thereof will be omitted.

The light emitting module 100 includes an LED unit 102 and a phosphor unit 104. The LED unit 102 includes a substrate 106 and an LED chip 22. The substrate 106 has an outer shape of a square. One LED chip 22 is mounted in the center of the substrate 106.

The phosphor unit 104 has a first phosphor layer 110 and a second phosphor layer 112. The first phosphor layer 110 contains blue phosphors (not shown) and yellow-green phosphors (not shown). The blue phosphors and the yellow-green phosphors contained in the first phosphor layer 110 are similar to those contained in the first phosphor layer 24 in the first exemplary embodiment.

The second phosphor layer 112 contains red phosphors (not shown). The red phosphors contained in the second phosphor layer 112 are similar to those contained in the second phosphor layer 26 in the first exemplary embodiment. The second phosphor layer 112 is directly applied to a mounting surface 106a of the substrate 106 on which the LED chips 22 have been mounted.

More specifically, a red phosphor paste, which contains the red phosphors 84, is first adjusted. A method for adjusting the red phosphor paste is similar to the method employed in the first exemplary embodiment. The red phosphor paste adjusted as above is applied to the mounting surface 106a of the substrate 106 on which the LED chip 22 has been mounted. At this time, similar to the first exemplary embodiment, the second phosphor layer 112 is applied such that the thickness of the second phosphor layer 112, in a light emitting direction, namely above the light emitting surface 22a is 80 μm. Note that the thickness of the second phosphor layer 26 formed above the light emitting surface 22a may be set to a value in a range of 20 to 200 μm.

The first phosphor layer 110 is further applied on top of this second phosphor layer 112. More specifically, a mixed phosphor paste, which contains the blue phosphors 80 and the yellow-green phosphors 82, is first adjusted. A method for adjusting the mixed phosphor paste is similar to the method employed in the first exemplary embodiment. The thus adjusted mixed phosphor paste is further applied on top of the already-coated red phosphor paste in an overlapped manner. At this time, the thickness of the first phosphor layer 110 is 4 mm. Note that the thickness of the first phosphor layer 110 may be set to a value in a range of 0.5 to 18 mm and may more preferably be set to a value in a range of 0.5 to 5 mm.

In this manner, the second phosphor layer 112 and the first phosphor layer 110 are stacked, in this order, on the mounting surface 106a of the substrate 106. In this case, the second phosphor layer 112 and the first phosphor layer 110 are stacked, as shown in FIG. 8B, such that a circle with radius equal to 5 mm with the center of the light emitting surface 22a set as the center of the circle forms an outer shape of the second phosphor layer 112 and the first phosphor layer 110. Note that the radius of the circle is not limited to 5 mm and the outer shape of the second phosphor layer 112 and the first phosphor layer 110 is not limited to the circular form. Also, the second phosphor layer 112 is applied to the mounting surface 106a such the thickness thereof is approximately uniform, whereas the first phosphor layer 110 is applied to an emission surface 112a of the second phosphor layer 112 such that the first phosphor layer 110 becomes semispherical.

The light emitting module 100 according to the second exemplary embodiment is turned on and the chromaticity distribution is measured. The center of the LED chip 22 is set as a reference point PO and then the chromaticity is measured starting from this reference point PO. As illustrated in FIG. 8B, the measurement of the chromaticity is repeated while the a measurement point is moved little by little toward an outer edge of the phosphor unit 104 until the measurement point reaches the outer edge of the phosphor unit 104. When the measurement point reaches the outer edge of the phosphor unit 104, the measurement of the chromaticity is terminated. Hereinafter, the direction along which the measurement point moves is referred to as a "measurement direction D2".

Figure 9A:
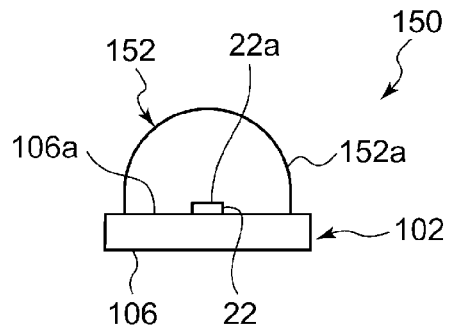
FIG. 9A is a front sectional view of a light emitting module according to a second comparative example.
Figure 9B:
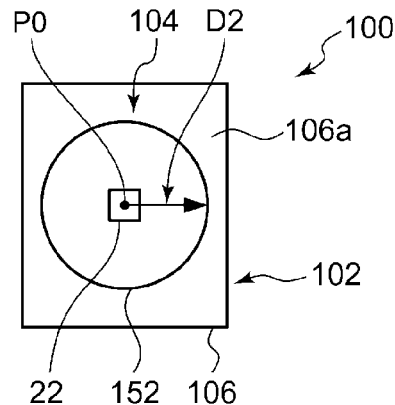
FIG. 9B is a top view of a light emitting module according to a second comparative example.

FIG. 9A is a front sectional view of a light emitting module 150 according to a second comparative example. FIG. 9B is a top view of the light emitting module 150 according to the second comparative example. Hereinbelow, the components in the second comparative example identical Lo those of the above-described exemplary embodiments and the comparative example are given the identical reference numerals, and the repeated description thereof will be omitted.

The light emitting module 150 includes an LED unit 102 and a phosphor layer 152. The phosphor layer 152 contains the red phosphors, the yellow-green phosphors and the blue phosphors used in the light emitting module 10. A method for preparing a mixed phosphor paste used to form the phosphor layer 152 is similar to the method employed in the first comparative example. The thus adjusted mixed phosphor paste is applied on top of the mounting surface 106a of the substrate 106 so as to form the phosphor layer 152. At this time, the width of the phosphor layer 152 is 4 mm.

(EXPERIMENTAL RESULT 2)

Figure 10:
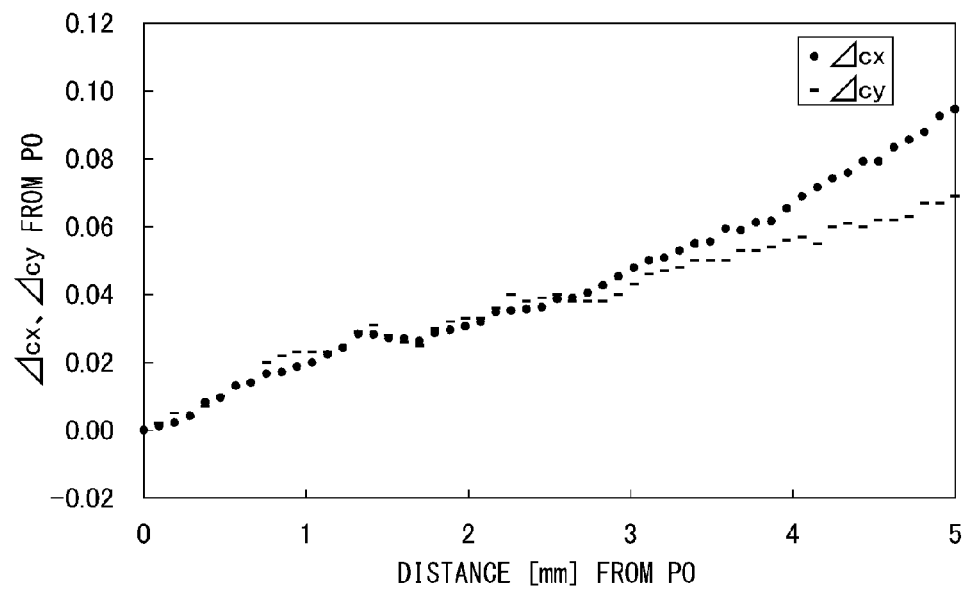
FIG. 10 is a diagram showing an experimental result obtained when, in a light emitting module according to a second comparative example, the chromaticity was measured while a measurement point was moved, along a measurement direction D2, from a reference point PO.

FIG. 10 is a diagram showing an experimental result obtained when, in the light emitting module 150 according to the second comparative example, the chromaticity was measured while a measurement point was moved, along the measurement direction D2, from the reference point PO. Δcx and Δcy in the vertical axis indicate change amounts at color coordinates (cx, cy) in CIE chromaticity coordinates with the CIE chromaticity at the reference point PO defined as the reference value.

In FIG. 10, as the distance from the reference point PO gets larger, the color difference from the reference point PO gets larger gradually. Thus, in the light emitting module 150 according to the second comparative example, the larger the distance from the reference point becomes, the more the emitted light is tinged with red color than when it is at the reference point PO and the less. As a result, one finds that the color of the emitted light is not uniform.

The mechanism of how the color of the emitted light is uneven as observed above is similar to that explained in the first comparative example. In other words, the light emitted, with a short optical path, from the light emitting surface 22a of the LED chip 22 reaches the reference point PO, and it is unlikely that the light emitted form the reference point PO will be again wavelength-converted by the red phosphor 84 so as to be red light. Here, the "light emitted, with a short optical path length, from the light emitting surface 22a of the LED chip 22" is the blue light emitted after the wavelength conversion by the blue phosphor 80 and the yellow-green light emitted after the wavelength conversion by the yellow-green phosphor 82.

In contrast, the light emitted from the light emitting surface 22a of the LED chip 22 has a directional characteristic of traveling vertically upward from the light emitting surface 22a. The light rays emitted from the spots located far from the reference point PO are light rays that have traveled in various directions within the phosphor layer 152 while they are wavelength-converted by the phosphors contained in the phosphor layer 152. Accordingly, the farther the spot, where light is emitted, is, the longer said light has traveled within the phosphor layer 152. Hence, the farther the spot, where the light is emitted, is, the more likely the blue light and the yellow-green light, which have been respectively wavelength-converted by the blue phosphors 80 and the yellow-green phosphor 82 and then emitted, will be again wavelength-converted to red light by the red phosphors 84. In this manner, the farther the spot, where the light is emitted, is, the light more tinged with red color will be emitted.

Figures 11, 12:
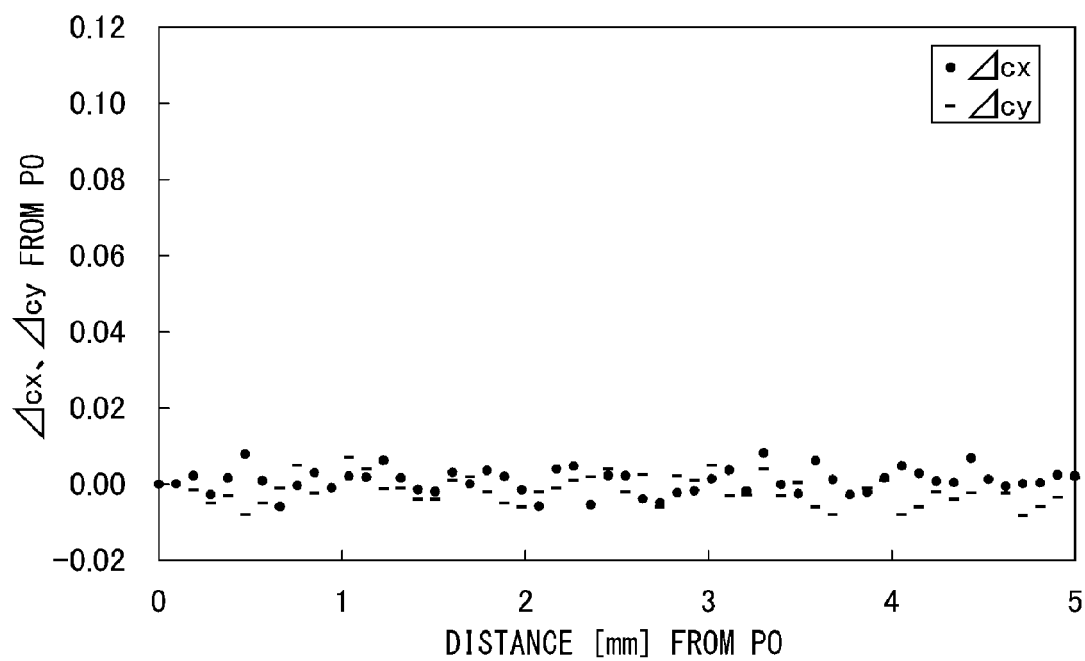
FIG. 11 is a diagram showing an experimental result obtained when, in a light emitting module according to a second exemplary embodiment, the chromaticity was measured while a measurement point was moved, along a measurement direction D2, from a reference point PO.
FIG. 12 shows a color rendering index Ra of each of a light emitting module according to a second exemplary embodiment and a light emitting module according to a second comparative example.

FIG. 11 is a diagram showing an experimental result obtained when, in the light emitting module 100 according to the second exemplary embodiment, the chromaticity was measured while a measurement point was moved, along the measurement direction D2, from the reference point PO. It is evident from FIG. 11 that Δcx and Δcy are each mostly uniform regardless of the distance from the reference point PO. Hence, one finds that almost no color unevenness occurs in the light emitting module 100 according to the second exemplary embodiment.

The mechanism of how the color of the emitted light is even as observed above is similar to that explained in the first comparative example. That is, for the light directed toward an emission surface 110a in the first phosphor layer 110, the possibility that the light, which has once been wavelength-converted by any one of the phosphors will be again wavelength-converted by other light is extremely low as compared with the second comparative example.

Further, part of light directed toward the mounting surface 106a in the blue light and the yellow-green light, which have been wavelength-converted in the first phosphor layer 110 and then emitted from the first phosphor layer 110, is converted into red light by the red phosphors 84 contained in the non-direct illumination area, which is located nearer to the mounting surface 106a side than the light emitting surface 22a. In this manner, the second phosphor layer 112, which contains the red phosphors 84, is formed in the non-direct illumination area. Thereby, the light, which travels toward the mounting surface 106a in the first phosphor layer 110 and then emits from a part of the emission surface 110a other than a part thereof corresponding to the region vertically upward from the LED chip 22, can also be turned into the light in which the blue light, the yellow-green light and the red light have been appropriately mixed together. From the above results, the light in which the blue light, the yellow-green light and the red light have been appropriately mixed together can be emitted from both a first part of the emission surface 110a and a second part of the emission surface 110a. Here, the first part of the emission surface 110a is part of the emission surface 110a corresponding to the region vertically upward from the light emitting surface 22a, and the second part thereof is the remaining part of the emission surface 110a other than the first part thereof. Note again that, as described above, the emission surface 110a is constituted by the first part and the second part. Thus, the color unevenness can be reduced over the entire emission surface 110a.

FIG. 12 shows a color rendering index Ra of each of the light emitting module 100 according to the second exemplary embodiment and the light emitting module 150 according to the second comparative example. As indicated in FIG. 12, the color rendering index Ra of the light emitting module 100 according to the second exemplary embodiment is a value exceeding "80", so that the light emitting module 100 can achieve higher color rendering properties than that of the light emitting module 150 according to the second comparative example. By employing the light emitting module 100 according to the second exemplary embodiment, the light having uniform color can be emitted while high color rendering properties can be achieved.

The present invention is not limited to the above-described exemplary embodiments only, and those resulting from any appropriate combination of components in the exemplary embodiments are also effective as embodiments. Also, it is understood by those skilled in the art that modifications such as various changes in design may be added to the exemplary embodiments based on their knowledge and that the exemplary embodiments added with such modifications are also within the scope of the present invention.

In one modification, the second phosphor layer and the first phosphor layer are stacked together without mounting, in advance, LED chips and the electrodes used to electrically connect the LED chips to the substrate. More specifically, a red phosphor paste is printed on the LED chip and the substrate, excluding the electrodes, by screen printing in a manner such that the thickness of the red phosphor paste to be applied thereon is 20 to 200 μm. The concentration of the red phosphor paste, the thickness of resin with which to seal the red phosphors and the thickness of the second phosphor layer are similar to those in the above-described first or second exemplary embodiment.

A sealing material used herein may be a glass-based material (e.g., a borosilicate-based, aluminosilicate-based, or soda-borosilicate-based material), which is any one of various kinds of low-melting-point-glass-based materials. In this case, the red phosphors 84 may be first processed as follows and then may be bonded onto the substrate. That is, the red phosphors 84 are sealed such that the concentration of the red phosphors 84 is 0.5 to 15 vol % and the thickness thereof is 20 to 600 μm (more preferably 20 to 200 μm), which is of such a size as to cover the surface of the substrate.

Also, for example, the LED chip, the electrodes and the like may be masked beforehand, and the red phosphor paste may be coated. A coating method used herein may use an air doctor coater, a blade coater, a rod coater, a knife coater, a squeeze coater, an impregnation coater, a reverse roll coater, a transfer roll coater, a gravure coater, a kiss coater, or the like, or may be cast coating, dip coating, spray coating, slot orifice coating, calendar coating, electrostatic powder coating, electrodeposition coating, powder electrodeposition coating, extrusion coating, spin coating or the like. And various other methods may be used according to the degree of viscosity of the red phosphor paste, the production cost thereof and so forth.

A description is now given of a method for forming a second phosphor layer, containing the red phosphors 84, on the LED chips. A red phosphor paste, whose phosphor concentration has been adjusted at 0.5 to 10 vol %, is first adjusted by using a silicon-based resin (e.g., dimethyl silicone/phenyl silicone/acrylic silicone-based resin), a sol-gel (silica, titania, or the like)-based resin, or a fluoropolymer-based resin. Then, the thus prepared red phosphor paste is applied using the dispensing coating or mold coating; alternately, the red phosphor paste, which has been partially or fully cured, is pasted. Also, a glass-based material (e.g., a borosilicate-based, aluminosilicate-based, or soda-borosilicate-based material), which is any one of various kinds of low-melting-point-glass-based materials is used as the sealing material. And the red phosphors may be first processed as follows and then may be bonded onto the LED chips. That is, the red phosphors are sealed such that the phosphor concentration is 0.5 to 10 vol %. In this case, the thickness of the second phosphor layer 26 is set to 20 to 200 μm.

When a mixed layer that contains the red phosphors 84, the blue phosphors 80 and the yellow-green phosphor 82 are formed as in the above-described first or second comparative example, this mixed layer can be formed by employing a method similar to that employed in forming a layer that contains the red phosphors 84 only. When the mixed layer is formed on the LED chips, an LED light emitting module, where the entire light-emitting part is illuminated with uniform color, can be fabricated.

After a layer of the red phosphors 84 has been formed on the LED chips, the layer of the red phosphors 84 is, as described above, partially or fully cured in a condition compatible with the resin material used. In order to obtain the light emitting module according to the first or second comparative example, the process similar to that described earlier is performed after the mixed layer of the red phosphors 84, the blue phosphors 80 and the yellow-green phosphor 82 has been formed.

If a glass sealing material is used, it will be cured according to a curing condition of an adhesive. After this, a mixed resin paste of the blue phosphors 80 and the yellow-green phosphors 82, whose phosphor concentration has been adjusted at 0.5 to 8 vol %, is adjusted by using a silicon-based resin (e.g., dimethyl silicone/phenyl silicone/acrylic silicone-based resin), a sol-gel (silica, titania, or the like)-based resin, or a fluoropolymer-based resin. The mixed resin paste of the blue phosphors 80 and the yellow-green phosphors 82 is applied on top of the substrate, to which the second phosphor layer has been applied, by using dispensing coating or is molded by using any one of various types of molds. Similarly, the mixed resin paste of the blue phosphors 80 and the yellow-green phosphors 82 is applied on top of the LED chips, to which the layer of the red phosphors 84 has been applied, as well as on top of the LED chips, to which the mixed layer of the blue phosphors 80 and the yellow-green phosphors 82 is applied, by using dispensing coating. Or the mixed resin paste thereof is molded by using any one of various types of molds. In this case, the thickness of the coating and the thickness of the mold are 0.5 to 18 mm (more preferably 0.5 to 5 mm).

After this, the mixed layer of the blue phosphors 80 and the yellow-green phosphors 82 is cured in a condition compatible with the resin material used. Also, a glass-based material (e.g., a borosilicate-based, aluminosilicate-based, or soda-borosilicate-based material), which is any one of various kinds of low-melting-point-glass-based materials can be used as the sealing material. And a mixture of the blue phosphors 80 and the yellow-green phosphors 82 is sealed such that the phosphor concentration of the mixture thereof is 0.1 to 10 vol % (more preferably, 0.5 to 10 vol %). Thereby, a phosphor-encapsulated glass (plate-like, molded component using any one of various molds), which has been processed to have a predetermined size of 0.5 to 18 mm in thickness (more preferably 0.5 to 5 mm in thickness) may be fabricated. Further, the mixture thereof may be bonded onto the substrate, to which the layer of the red phosphors 84 has been applied, and the LED chips, to which the layer of the red phosphors 84 or the mixed layer of the red phosphors 84, the blue phosphors 80 and the yellow-green phosphors 82 has been applied.

(Modification of Phosphors Used in the Second Phosphor Layer)

The phosphors used in the above-described second phosphor layer is not limited to the red phosphors and may be phosphors where at least part of light emitted by the phosphors contained in the first phosphor layer is an excitation light. For example, green phosphors, which absorb blue phosphors and yellow phosphors contained in the first phosphor layer, may be used for the second phosphor layer.

The phosphors contained in the second phosphor layer may be made of a single type of phosphor or a plurality of types of phosphors. For example, in order that the chromaticity and the color rendering properties can be set to desired values, green phosphors, where at least part of light emitted by the red phosphors and the blue phosphors is an excitation light, may be mixed.

The green phosphor used herein may be any one of phosphors expressed by the following general formulae, for instance. Note that the following phosphors are merely exemplary and green phosphors other than the following ones may be used.

A phosphor expressed by a general formula of $(Si, Al)_6(O, N)_8$:Eu(β-sialon)

A phosphor expressed by a general formula of $(Sr_{1-x-y}, Ca_x)Ga_2(S_z, Se_{1-z})_4$:Eu$_y^{2+}$ (where "x", "y" and "z" each lies in a range such that $0 \leq x<1$, $0<y<0.2$, $0<x+y \leq 1$, $0<z \leq 1$).

A phosphor expressed by a general formula of $(Sr_{1-x-y-z}, Ca_x, Ba_y, Mg_z)_2SiO_4$:Eu$_w^{2+}$ (where "x", "y", "z" and "w" each lies in a range such that $0<x<1$, $0.5<y<1$, $0<z<1$, $0.03<w<0.2$, $0<x+y+z+w<1$).

A phosphor expressed by a general formula of $Y_3(Al_{1-x}, Ga_x)_5O_{12}$:Ce ($0<x \leq 1$).

A phosphor expressed by a general formula of $CaSc_2Si_3O_{12}$:Ce.

A phosphor expressed by a general formula of $CaSc_2O_4$:Eu. A phosphor expressed by a general formula of $(Ba, Sr)_3Si_2O_3N$:Eu$^{2+}$.

A phosphor expressed by a general formula of $NaBaScSi_2O_7$:Eu$^{2+}$.

(Concentration Distribution of Phosphors in the Second Phosphor Layer)

Figure 13A:
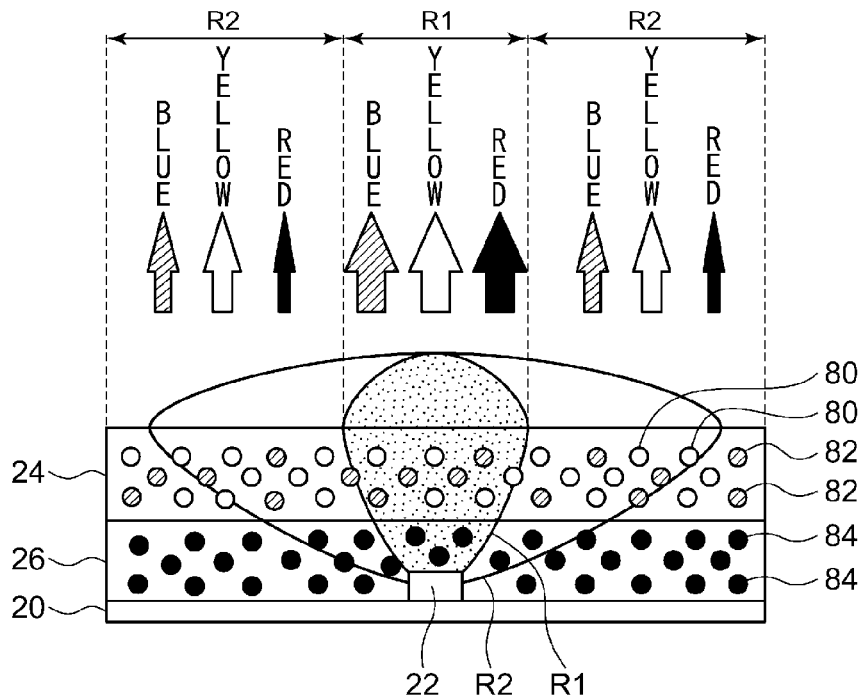
FIG. 13A is a diagrams schematically showing variations in color of light irradiated from a light emitting module, in the case when the concentration distribution of phosphors in a second phosphor layer is uniform.
Figure 13B:
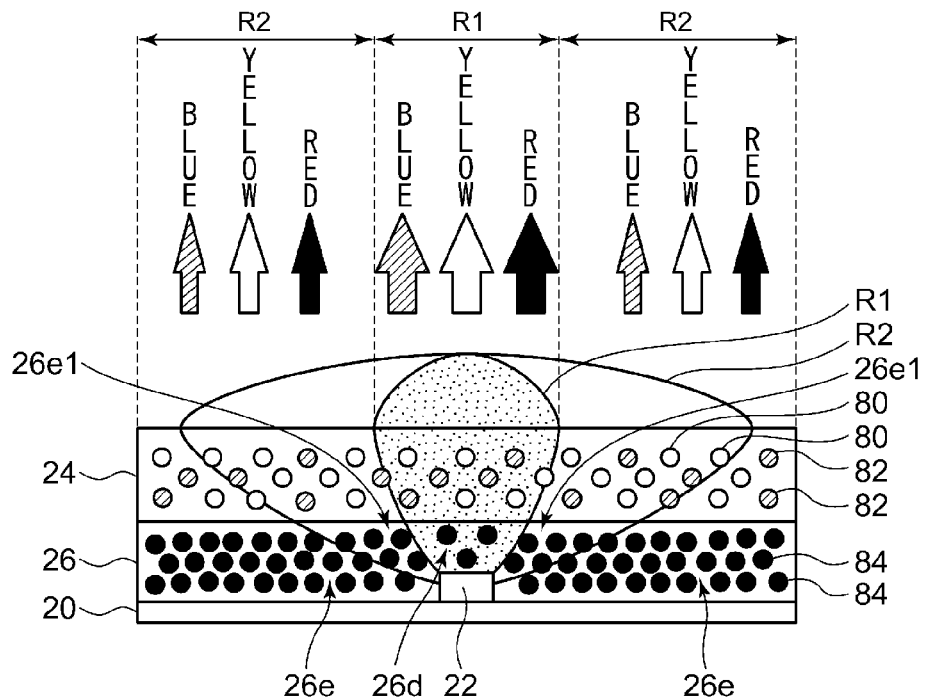
FIG. 13B is a diagrams schematically showing variations in color of light irradiated from a light emitting module, in the case when the concentration distribution of phosphors in a second phosphor layer is varied.

For the above-described second phosphor layer, the concentration distribution of phosphors contained in the second phosphor layer is not particularly taken into consideration. Thus there is room for improvement regarding the uniformity of color of light irradiated from a light emitting module. FIG. 13A is a diagrams schematically showing variations in color of light irradiated from the light emitting module, in the case when the concentration distribution of phosphors in the second phosphor layer is uniform. FIG. 13B is a diagrams schematically showing variations in color of light irradiated from the light emitting module, in the case when the concentration distribution of phosphors in the second phosphor layer is varied.

When, as shown in FIG. 13A, the concentration of the red phosphors 84 contained in the second phosphor layer 26 on the substrate 20 is uniform, the qualitative intensity levels of phosphor light of each color in a region R1 and regions R2 are shown in Table 1. Here, the region R1 is a region where the light emitted from the LED chip 22 is relatively strong, and the regions R2 are regions, which surround the region R1, where the light emitted from the LED chip 22 is relatively weak.

TABLE 1

| Illumination area | R2 | R1 | R2 |
|---|---|---|---|
| Light irradiated from an LED chip | Weak | Strong | Weak |
| Light of blue phosphor | Weak | Strong | Weak |
| Light of yellow-green phosphor | Weak | Strong | Weak |
| Light of red phosphor | Weaker than blue and yellow-green phosphors | Strong | Weaker than blue and yellow-green phosphors |
| Concentration of red phosphor | | Constant | |

As shown in Table 1, the phosphor light of each color in the region R1 where the light irradiated from the LED chip 22 is strong is stronger than that in the regions R2 where the light irradiated from the LED chip 22 is weak. As illustrated in FIG. 13A, the light irradiated from the LED chip 22 radiates in all directions and therefore the range in which the red phosphors 84, contained in the second phosphor layer 26, near the LED chip 22 are excited is narrower than the range in which the blue phosphors 80 and the yellow-green phosphors 82, contained in the first phosphor layer 24, far from the LED chip 22 are excited. As a result, the red phosphor light in the regions R2 is relatively weaker than the blue phosphor light and the yellow-green phosphor light. Hence, the brightness becomes uneven in between the region R1 and the regions R2 and the variations in color are also caused in therebetween.

In the light of the above facts, as shown in FIG. 13B, the concentration of the red phosphors 84 is varied depending on the position of the red phosphors 84 in the second phosphor layer 26. Thereby, the aforementioned variations in color can be suppressed. More specifically, the concentration of the red phosphors 84 in the second phosphor layer 26 is set such that the concentration thereof in regions 26e is higher than the concentration thereof in a region 26d. Here, the regions 26e are located far from the LED chip 22 and are regions where the light emitted from the LED chip 22 is weak; the region 26d is located right above (vertically upward from) the LED chip 22 and is a region where the light emitted from the LED chip 22 is strong. It is more preferable to increase the concentration of the red phosphors 84 in the region 26e1 contained in a part of the regions R2, where the light emitted therefrom is weak, and the region 26e1 is a region which is common part of, namely intersection of, the region R2 and the region 26e.

When, as shown in FIG. 13B, in the red phosphors 84 contained in the second phosphor layer 26 located right above the substrate 20, the concentration of the red phosphors 84 in the regions 26e is higher than the concentration thereof in the region 26d, the qualitative intensity levels of phosphor light of each color in the region R1 and the regions R2 are shown in Table 2. Here, the region R1 is a region where the light emitted from the LED chip 22 is strong, and the regions R2 are regions, which surround the region R1, where the light emitted from the LED chip 22 is weak.

TABLE 2

| Illumination area | R2 | R1 | R2 |
|---|---|---|---|
| Light irradiated from an LED chip | Weak | Strong | Weak |
| Light of blue phosphor | Weak | Strong | Weak |
| Light of yellow-green phosphor | Weak | Strong | Weak |
| Light of red phosphor | Equivalent to blue and yellow-green phosphors | Strong | Equivalent to blue and yellow-green phosphors |
| Concentration of red phosphor | High | Low | High |

As shown in Table 2, the phosphor light of each color in the region R1 where the light irradiated from the LED chip 22 is strong is stronger than that in the regions R2 where the light irradiated from the LED chip 22 is weak. As illustrated in FIG. 13B, the light irradiated from the LED chip 22 radiates in all directions and therefore the range in which the red phosphors 84, contained in the second phosphor layer 26, near the LED chip 22 are excited is narrower than the range in which the blue phosphors 80 and the yellow-green phosphors 82, contained in the first phosphor layer 24, far from the LED chip 22 are excited. However, the concentration of the red phosphors 84 in the regions 26e, in the second phosphor layer 26, contained in the region R2 is high. Thus, the red phosphor light equivalent to the blue phosphor light and the yellow-green phosphor light is emitted from the red phosphors, in the second phosphor layer 26, which is also contained in the region R2. As a result, a comparatively large difference of phosphor light of each color between the region R1 and the regions R2 is no longer present and therefore the uniformity of color is improved.

It is to be noted here that the aforementioned concentration distribution of phosphors in the second phosphor layer is merely exemplary. The phosphors may be determined and selected, as appropriate, in terms of the light distribution of an LED chip, the shape of each phosphor layer, the type and/or concentration of phosphors contained in each phosphor layer, and so forth.

(Modification of the Shape of the Second Phosphor Layer)

As shown in FIG. 7, for example, the above-described second phosphor layer 26 is formed such that the thickness of the first layer 26b is constant. However, the thickness of the first layer 26b is not necessarily constant across the entire substrate, and the shape thereof may be selected, as appropriate, according to the light distribution required by an LED module, the concentration of phosphors in each phosphor layer, and so forth.

Figure 14:
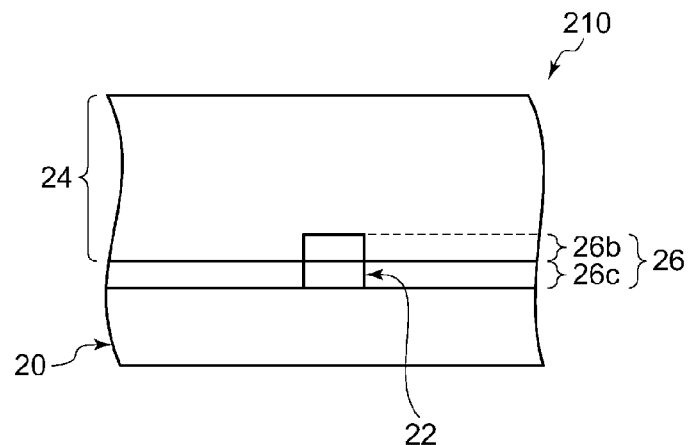
FIG. 14 is a partial sectional view of a light emitting module showing a modification of a second phosphor layer.

FIG. 14 is a partial sectional view of a light emitting module 210 showing a modification of the second phosphor layer. As shown in FIG. 14, the first layer 26b of the second phosphor layer 26 is formed only in the position right above (vertically upward from) and near the LED chip 22 and is not formed at all in other regions. The shape of the second phosphor layer is devised as described in conjunction with FIG. 14, so that the quantity of red phosphor light can be appropriately controlled in regions, which are located right above and near the LED chip 22, where the light emitted directly from the LED chip 22 is strong, and the other regions. As a result, the uniformity of color of light irradiated from the light emitting module 210 is improved.

Figure 15A:
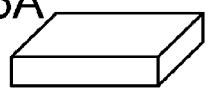
FIGS. 15A to 15F are each a perspective view, a cross-sectional view or a top view of an exemplary shape of a second phosphor layer.
Figure 15B:
Figure 15C:
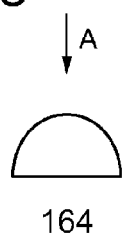
Figure 15D:
Figure 15E:
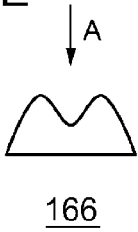
Figure 15F:

Several specific examples of modifications in the shape of a second phosphor layer will now be explained. FIGS. 15A to 15F are each a perspective view, a cross-sectional view or a top view of an exemplary shape of the second phosphor layer. A second phosphor layer 160 shown in FIG. 15A has a shape of a rectangular parallelepiped (is of a plate-like shape). A second phosphor layer 162 shown in FIG. 15B is semi-cylindrical. A second phosphor layer 164 shown in FIG. 15C and FIG. 15D is semicircular in cross section and is circular dome-shaped when viewed from top. FIG. 15D is a top view as viewed from a direction of arrow A of FIG. 15C. A second phosphor layer 166 shown in FIG. 15E and FIG. 15F is of a mountain shape, where a central part is recessed, in cross section and is of a circular lens shape when viewed from top. FIG. 15F is a top view as viewed from a direction of arrow A of FIG. 15E. Note that the shape of the second phosphor layer is not limited to the shapes as shown in FIG. 15A to FIG. 15F.

Figure 16:
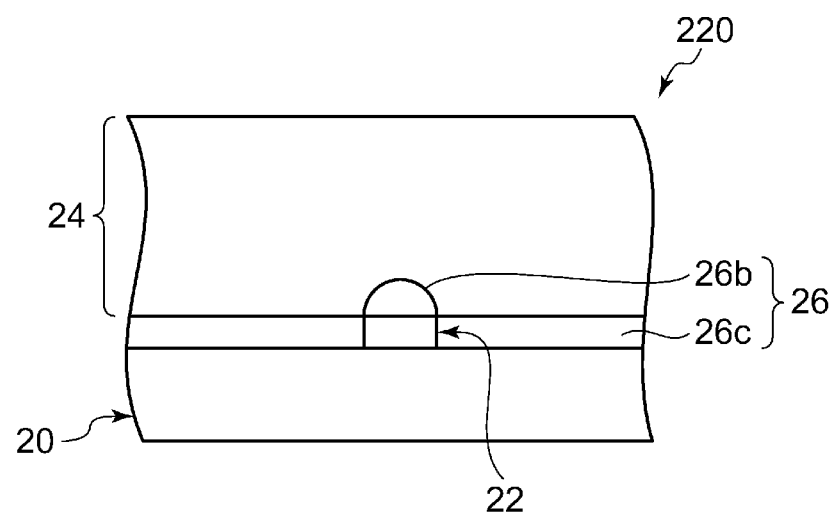
FIG. 16 is a partial sectional view of a light emitting module showing a modification of a second phosphor layer.

Also, a plurality of the above-described shapes may be combined into a new shape of the second phosphor layer. FIG. 16 is a partial sectional view of a light emitting module 220 showing a modification of the second phosphor layer. The light emitting module 220 is formed such that the portion of the second phosphor layer 26 above the LED chip 22 is dome-shaped as shown in FIG. 15C and the other portion thereof has a plate-like second phosphor layer 26 as shown in FIG. 15A. The second phosphor layer 26 is so formed that the shapes as described above are combined, and thereby the quantity of red phosphor light can be appropriately controlled in regions, which are located right above and near the LED chip 22, where the light emitted directly from the LED chip 22 is strong, and the other regions. As a result, the uniformity of color of light irradiated from the light emitting module 220 is improved.

(Modification of the Shape Dimensions of the Phosphor Layers)

Figure 17A:
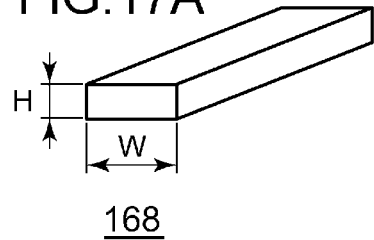
FIG. 17A and FIG. 17B are each a perspective view showing a modification of phosphor layers as a whole in a light emitting module according to a first exemplary embodiment.
Figure 17B:
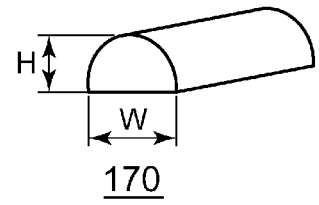

Similar to the aforementioned shapes of the second phosphor layer, several examples of the shape of the entire phosphor layer including a first phosphor layer and a second phosphor layer will now be explained. FIG. 17A and FIG. 17B are each a perspective view showing a modification of the phosphor layers as a whole in the light emitting module 10 according to the first exemplary embodiment. FIGS. 18A to 18E are each a perspective view, a cross-sectional view or a top view showing a modification of phosphor layers as a whole in the light emitting module 100 according to the second exemplary embodiment.

Figure 18A:
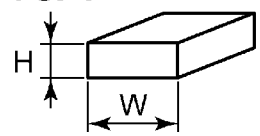
FIGS. 18A to 18E are each a perspective view, a cross-sectional view or a top view showing a modification of phosphor layers as a whole in a light emitting module according to a second exemplary embodiment.
Figure 18B:
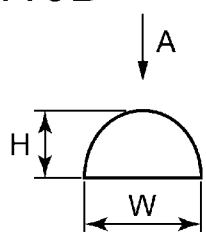
Figure 18C:
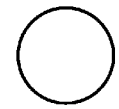
Figure 18D:
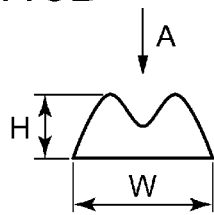
Figure 18E:

A phosphor layer 168 shown in FIG. 17A has a shape of a rectangular parallelepiped (is of a plate-like shape). A phosphor layer 170 shown in FIG. 17B is semi-cylindrical. A phosphor layer 172 shown in FIG. 18A has a shape of a rectangular parallelepiped (is of a plate-like shape). A phosphor layer 174 shown in FIG. 18B and FIG. 18C is semicircular in cross section and is circular dome-shaped when viewed from top. FIG. 18C is a top view as viewed from a direction of arrow A of FIG. 18B. A phosphor layer 176 shown in FIG. 18D and FIG. 18E is of a mountain shape, where a central part is recessed, in cross section and is of a circular lens shape when viewed from top. FIG. 18E is a top view as viewed from a direction of arrow A of FIG. 18D.

Here, the dimensions of each phosphor layer shown in FIGS. 17A and 17B and FIGS. 18A to 18E are preferably about 0.5 mm to about 18 mm in height and about 0.5 mm to about 20 mm in width. Note that the shape of the entire phosphor layer is not limited to the shapes as shown in FIGS. 17A and 17B and FIGS. 18A to 18E.

(The Interval Between LED Chips and the Driving Current for the LED Chips in the Light Emitting Module According to the First Exemplary Embodiment)

Where a plurality of LED chips 22 are placed as in the light emitting module 10 of the first exemplary embodiment, an appropriate interval between the LED chips may possibly vary depending on the value of current that is supplied to each LED chip 22. This is because bright and dark areas will be created in the light emitting module 10 and therefore the illumination will not be uniform if the interval between the plurality of LED chips 22 placed is wider than the appropriate interval. This is also because there will be an increase in costs if, conversely, the interval is narrower than the appropriate interval and thereby the number of LED chips 22 increases more than is necessary.

In view of the above problem, the interval between the LED chips 22 and the value of optimum current delivered to each LED chip 22 is preferably related as follows. That is, when, for example, the interval between the LED chips is 0.5 to 5 mm, the driving current is preferably set in a range of 10 to 30 mA. When the interval between the LED chips is 3.0 to 20 mm, the driving current is preferably set in a range of 20 to 300 mA. When the interval between the LED chips is 10 to 50 mm, the driving current is preferably set in a range of 100 to 1000 mA. When the interval between the LED chips is 30 to 100 mm, the driving current is preferably set in a range of 300 to 1500 mA. More specifically, when the value of current delivered to each LED chip 22 is 100 mA, the interval between the LED chips is suitably about 8 mm. Setting the interval between the LED chips 22 and the driving current to the above relation can achieve the uniform illumination of the light emitting module while suppressing the number of LED chips used.

(The Suppression of Light Leaked from the Second Phosphor Layer)

When, as in the light emitting module 100 shown in FIGS. 8A and 8B, the second phosphor layer 112 located below the first phosphor layer 110 is exposed from the lateral face, the following phenomena (1) and (2) may possibly occur.

(1) When the LED chip is turned off, the color (e.g., red) of the second phosphor layer 112 is conspicuously strong and emphasized only at an outer periphery of the surface of the second phosphor layer 112 in contact with the substrate 106. As a result, the outer periphery thereof appears ring-like.

(2) When the LED chip is even turned on, the color (e.g., red) of the second phosphor layer 112 is conspicuously strong and emphasized, depending on the thickness of the second phosphor layer 112 and the concentration of phosphors in the second phosphor layer 112, only at the outer periphery of the surface of the second phosphor layer 112 in contact with the substrate 106. This may appear ring-like.

Figure 19A:
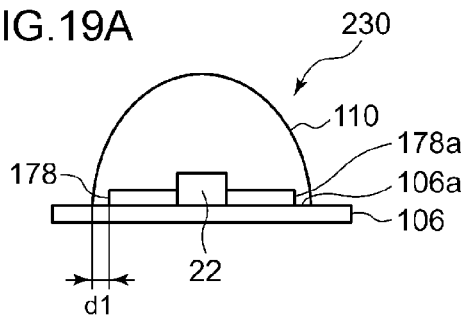
FIG. 19A is a cross-sectional view of a light emitting module where a lateral face of a second phosphor layer is covered with a first phosphor layer.
Figure 19B:
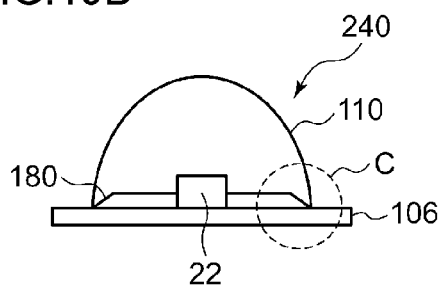
FIG. 19B is a cross-sectional view of a light emitting module where the thickness of a second phosphor layer is made smaller toward the exterior at an outer circumferential part of the second phosphor layer.
Figure 19C:
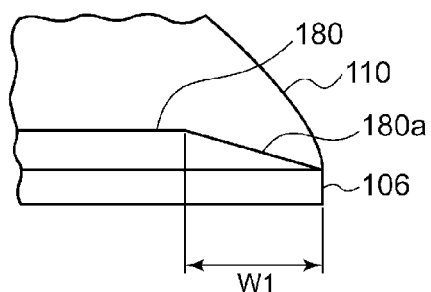
FIG. 19C is an enlarged view of a region C shown in FIG. 19B.
Figure 19D:
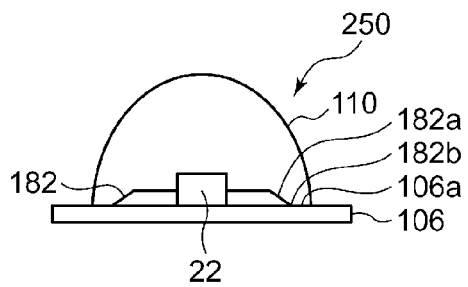
FIG. 19D is a cross-sectional view of a light emitting module where the thickness of a second phosphor layer is made small toward the exterior at the outer circumferential part of the second phosphor layer shown in FIG. 19A.

In the light of this, the inventors had conceived and designed the following structures. FIG. 19A is a cross-sectional view of a light emitting module 230 where a lateral face of the second phosphor layer is covered with the first phosphor layer. FIG. 19B is a cross-sectional view of a light emitting module 240 where the thickness of the second phosphor layer is made smaller toward the exterior at an outer circumferential part of the second phosphor layer. FIG. 19C is an enlarged view of a region C shown in FIG. 19B. FIG. 19D is a cross-sectional view of a light emitting module 250 where the thickness of the second phosphor layer is made smaller toward the exterior at the outer circumferential part of the second phosphor layer shown in FIG. 19A. Note that, each of FIGS. 19A to 19D, the same components as those of FIG. 8 will be denoted with the same reference numerals, and the description thereof will be omitted.

In the light emitting module 230 shown in FIG. 19A, the first phosphor layer 110 is so provided as to cover an outer circumferential lateral face 178a of a second phosphor layer 178. That is, the first phosphor layer 110 directly coverts part of the mounting surface 106a of the substrate 106. With this structure, the outer circumferential lateral face 178a of the second phosphor layer 178 is no longer exposed. Thus, this structure suppresses the color (e.g., red) of the second phosphor layer 178 from appearing ring-like when the LED chip is turned on or off. A distance d1 between the outer circumferential lateral face 178a of the second phosphor layer 178 and the surface of the first phosphor layer 110 is preferably about 0.1 mm to about 3 mm. If the distance d1 is less than 0.1 mm, the color (e.g., red) of the second phosphor layer 178 may possibly appear ring-like when the LED chip is turned on or off. If the distance d1 exceeds 3 mm, the volume of the second phosphor layer 178 will be too small and therefore a tinge of red in the light emitted from the light emitting module 230 will be reduced.

The light emitting module 240 shown in FIG. 19B has a ring-like tapered surface 180a where the thickness of a second phosphor layer 180 is thinner toward the exterior at the outer circumferential part of the second phosphor layer 180. The width w of the tapered surface is preferably about 0.1 mm to about 3 mm. The light emitting module 250 shown in FIG. 19D has a ring-like tapered surface 182a where the thickness of a second phosphor layer 182 is thinner toward the exterior at the outer circumferential part of the second phosphor layer 182. An outer edge portion 182b of the tapered surface 182a is positioned more inwardly than the surface of the first phosphor layer 110 and therefore the second phosphor layer 182 is not exposed to the exterior. Thus, the light emitting module 240 and the light emitting module 250 suppress the color (e.g., red) of the second phosphor layer from appearing ring-like when the LED chip is turned on or off.

(A Correlation Between the Width of the First Phosphor Layer and the Width of the Second Phosphor Layer)

Suppose, as shown in FIG. 8, that in the second phosphor layer 112 there is a first layer formed on an emission surface side above the plane including the light emitting surface 22a of the LED chip 22. If, In this case, the ratio of the thickness of the first phosphor layer 110, namely the distance to the emission surface 110a, and a projected area of the second phosphor layer 112 facing the emission surface 110a differs according to directions, the color of light emitted from the LED chip will not be uniform depending on a light emitting direction of the light emitting module 100. In the light emitting module 100 shown in FIG. 8, said ratio greatly differs between in the vertical direction and in the horizontal direction of the LED chip 22.

Figure 20:
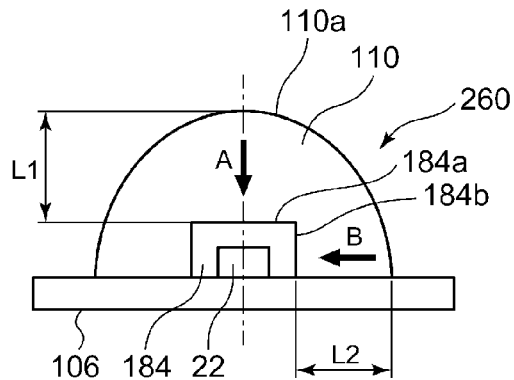
FIG. 20 is an example of a light emitting module where the ratio of the projected area of a first phosphor layer and the projected area of a second phosphor layer is almost identical in a plurality of directions.

FIG. 20 is an example of a light emitting module where the ratio of the thickness of a first phosphor layer and the projected area of a second phosphor layer is almost identical in a plurality of directions. Define, in a light emitting module 260 shown in FIG. 20, that the distance between a top face 184a of a second phosphor layer 184 and the emission surface 110a of the first phosphor layer 110 is L1. Similarly, define that the area of the top face 184a of the second phosphor layer 184 (the projected area of the second phosphor layer 184 as viewed from a direction A) is S1. Define that the distance between a lateral face 184b of the second phosphor layer 184 and the emission surface 110a of the first phosphor layer 110 is L2. And define that the area of the lateral face 184b of the second phosphor layer 184 (the projected area of the second phosphor layer 184 as viewed from a direction B) is S2. It is preferable that the following Equation (1) be met.

$$L1/S1 \approx L2/S2 \qquad \text{Equation (1)}$$

Thereby, the variations in color of light irradiated from the light emitting module 260 in the light emitting directions are reduced.

Figure 21:
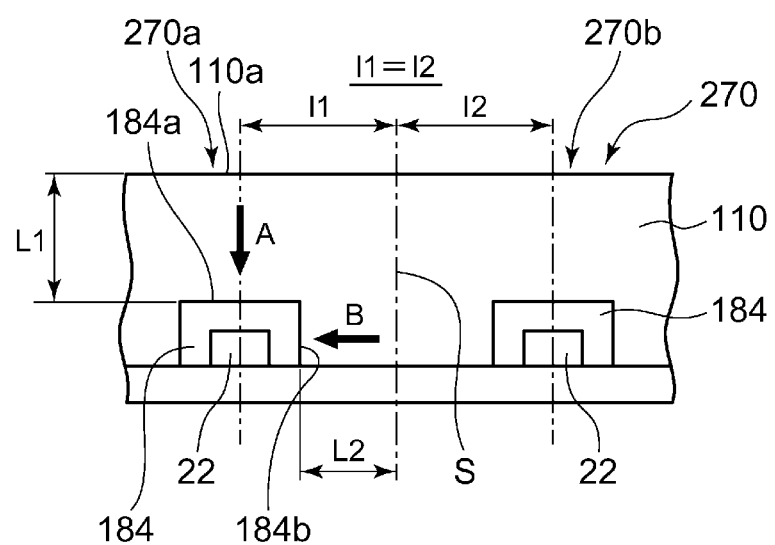
FIG. 21 is another example of a light emitting module where the ratio of the thickness of a first phosphor layer and the projected area of a second phosphor layer is almost identical in a plurality of directions.

FIG. 21 is another example of a light emitting module where the ratio of the thickness of a first phosphor layer and the projected area of a second phosphor layer is almost identical in a plurality of directions. A light emitting module 270 shown in FIG. 21 greatly differs from the light emitting module 260 shown in FIG. 20 in that the light emitting module 270 of FIG. 21 is provided with a plurality of LED chips 22. However, the light emitting module 270 is thought of as two light emitting modules 270a and 270b that are placed side by side with a boundary S located in between the light emitting modules 270a and 270b, wherein the boundary S contains an intermediate point of one LED chip 22 and an LED chip 22 adjacent said LED chip 22. Then, it suffices that the similar relation in the light emitting module 260 of FIG. 20 is met for the purpose of making uniform the color of light emitted from a plurality of LED chips in the light emitting directions.

In other words, it is preferable that the above Equation (1) be met. Here, define, in the light emitting modules 270a (270b) shown in FIG. 21, that the distance between the top face 184a of the second phosphor layer 184 and the emission surface 110a of the first phosphor layer 110 is L1. Define that the area of the top face 184a of the second phosphor layer 184 (the projected area of the second phosphor layer 184 as viewed from the direction A) is S1. Define that the distance between the lateral face 184b of the second phosphor layer 184 and boundary S is L2. And define that the area of the lateral face 184b of the second phosphor layer 184 (the projected area of the second phosphor layer 184 as viewed from the direction B) is S2. Thereby, the variations in color of light irradiated from the light emitting module 270 in the light emitting directions are reduced.

What is claimed is:

1. A light emitting module comprising:
    a first phosphor layer; and
    a second phosphor layer, whose wavelength after a conversion of wavelength is longer than that of the first phosphor layer,
    wherein the first phosphor layer is formed in an illumination area of light emitted from a light emitting element, and the first phosphor layer converts a wavelength of the light from the light emitting element and emits the wavelength-converted light from an emission surface,
    at least part of the second phosphor layer is formed in a predetermined area where no light is illuminated from said light emitting element and where light is illuminated from the first phosphor layer,
    the at least part of the second phosphor layer formed in said predetermined area converts the wavelength of the light from the first phosphor layer and emits the wavelength-converted light from the emission surface through the first phosphor layer,
    at least part of the second phosphor layer is formed in between a plane including a light emitting surface of the light emitting element and a mounting surface of a substrate on which the light emitting element is mounted,
    the first phosphor layer is formed nearer to a light emitting direction side of the light emitting surface than the second phosphor layer,
    the second phosphor layer is formed starting from the mounting surface and further toward the light emitting direction side of the light emitting surface beyond the plane, in such a manner as to cover the light emitting surface, and
    concentration of phosphors in a region of the second phosphor layer away from the emission surface is higher than concentration of phosphors in a region directly above the emission surface.

2. A light emitting module according to claim 1, wherein a plurality of light emitting elements are arranged such the light emitting elements are spaced apart from each other and such that each emitting surface is included in a plane,
    wherein at least part of the second phosphor layer is formed, in a region between the plurality of light emitting elements as viewed from a side of the light emitting surface, on an opposite side to a light emitting direction side of the light emitting surface, which is located downwardly from the plane, and
    wherein the first phosphor layer is formed nearer to the light emitting direction side of the light emitting surface than the second phosphor layer.

* * * * *